US008659947B2

(12) United States Patent
Iwai et al.

(10) Patent No.: US 8,659,947 B2
(45) Date of Patent: Feb. 25, 2014

(54) NONVOLATILE SEMICONDUCTOR MEMORY DEVICE

(71) Applicant: Kabushiki Kaisha Toshiba, Minato-ku (JP)

(72) Inventors: Hitoshi Iwai, Kamakura (JP); Tomoki Higashi, Yokohama (JP); Shinichi Oosera, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/870,164

(22) Filed: Apr. 25, 2013

(65) Prior Publication Data

US 2013/0229876 A1    Sep. 5, 2013

Related U.S. Application Data

(63) Continuation of application No. 13/041,579, filed on Mar. 7, 2011, now abandoned.

(30) Foreign Application Priority Data

Sep. 21, 2010 (JP) ................................. 2010-211326

(51) Int. Cl.
*G11C 16/04* (2006.01)

(52) U.S. Cl.
USPC ................... 365/185.17; 365/72; 365/185.11; 365/230.03; 365/243

(58) Field of Classification Search
USPC ............. 365/72, 185.11, 185.17, 230.03, 243
See application file for complete search history.

(56) References Cited

U.S. PATENT DOCUMENTS

| 6,944,048 | B2 | 9/2005 | Iwata |
| 7,508,710 | B2 * | 3/2009 | Mokhlesi ................. 365/185.17 |
| 7,511,996 | B2 * | 3/2009 | Kim .......................... 365/185.02 |
| 8,179,723 | B2 * | 5/2012 | Mokhlesi ................. 365/185.17 |
| 2007/0252201 | A1 | 11/2007 | Kito et al. |
| 2008/0048237 | A1 | 2/2008 | Iwata |
| 2010/0090188 | A1 | 4/2010 | Futatsuyama |
| 2010/0172189 | A1 | 7/2010 | Itagaki et al. |
| 2010/0207195 | A1 | 8/2010 | Fukuzumi et al. |
| 2010/0238732 | A1 | 9/2010 | Hishida et al. |
| 2011/0198687 | A1 | 8/2011 | Lee |
| 2012/0008400 | A1 | 1/2012 | Fukuzumi et al. |

FOREIGN PATENT DOCUMENTS

| JP | 2009-266312 | 11/2009 |
| KR | 10-2010-0082319 | 7/2010 |
| KR | 10-0979906 | 9/2010 |

OTHER PUBLICATIONS

Office Action mailed Aug. 31, 2012 in Korean Patent Application No. 10-2011-0023763 (w/English language translation).

* cited by examiner

*Primary Examiner* — Thao Bui
(74) *Attorney, Agent, or Firm* — Oblon, Spivak, McClelland, Maier & Neustadt, L.L.P.

(57) ABSTRACT

A nonvolatile semiconductor memory device comprises a plurality of memory blocks, each including a plurality of cell units and each configured as a unit of execution of an erase operation. Each of the cell units comprises a memory string, a first transistor, a second transistor, and a diode. The first transistor has one end connected to one end of the memory string. The second transistor is provided between the other end of the memory string and a second line. The diode is provided between the other end of the first transistor and a first line. The diode comprises a second semiconductor layer of a first conductivity type and a third semiconductor layer of a second conductivity type.

10 Claims, 35 Drawing Sheets

Row Direction Cross-sectional View

Column Direction Cross-sectional View

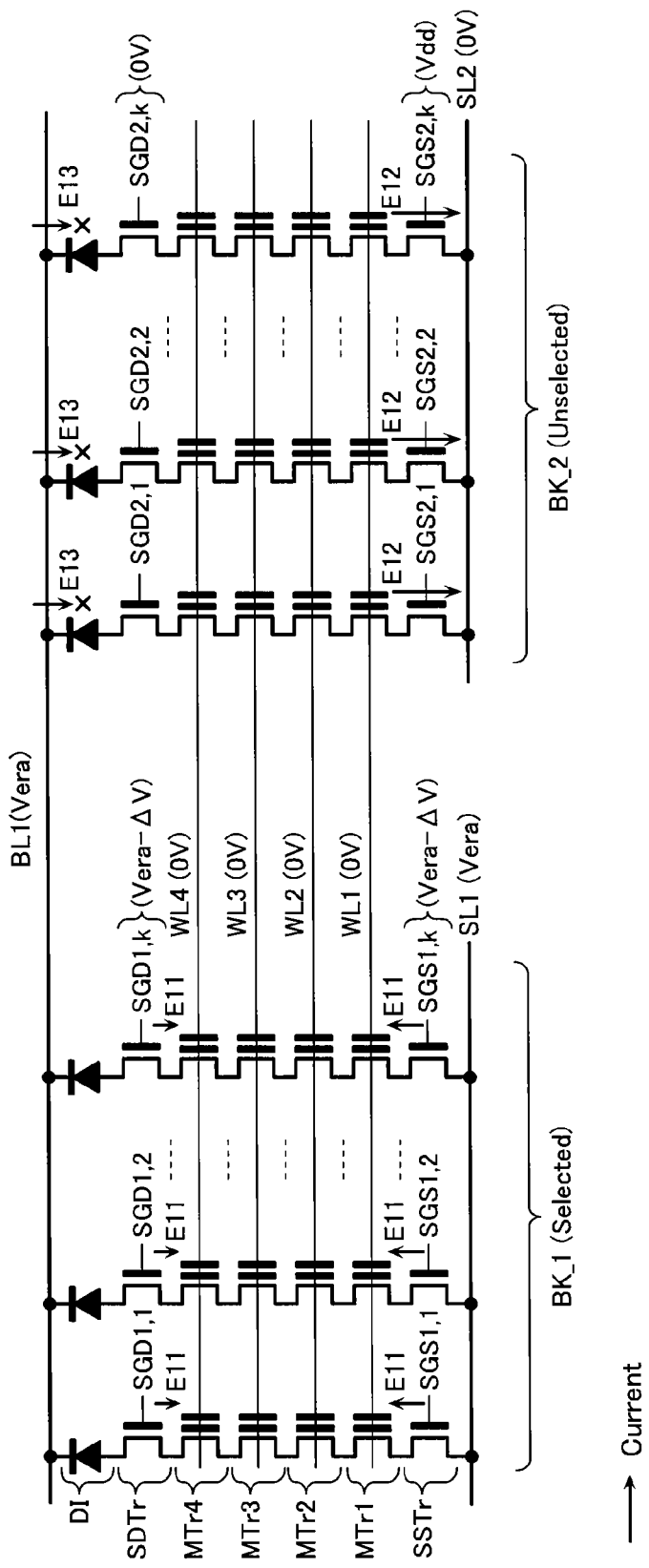
FIG. 6 First Embodiment (First Erase Operation)

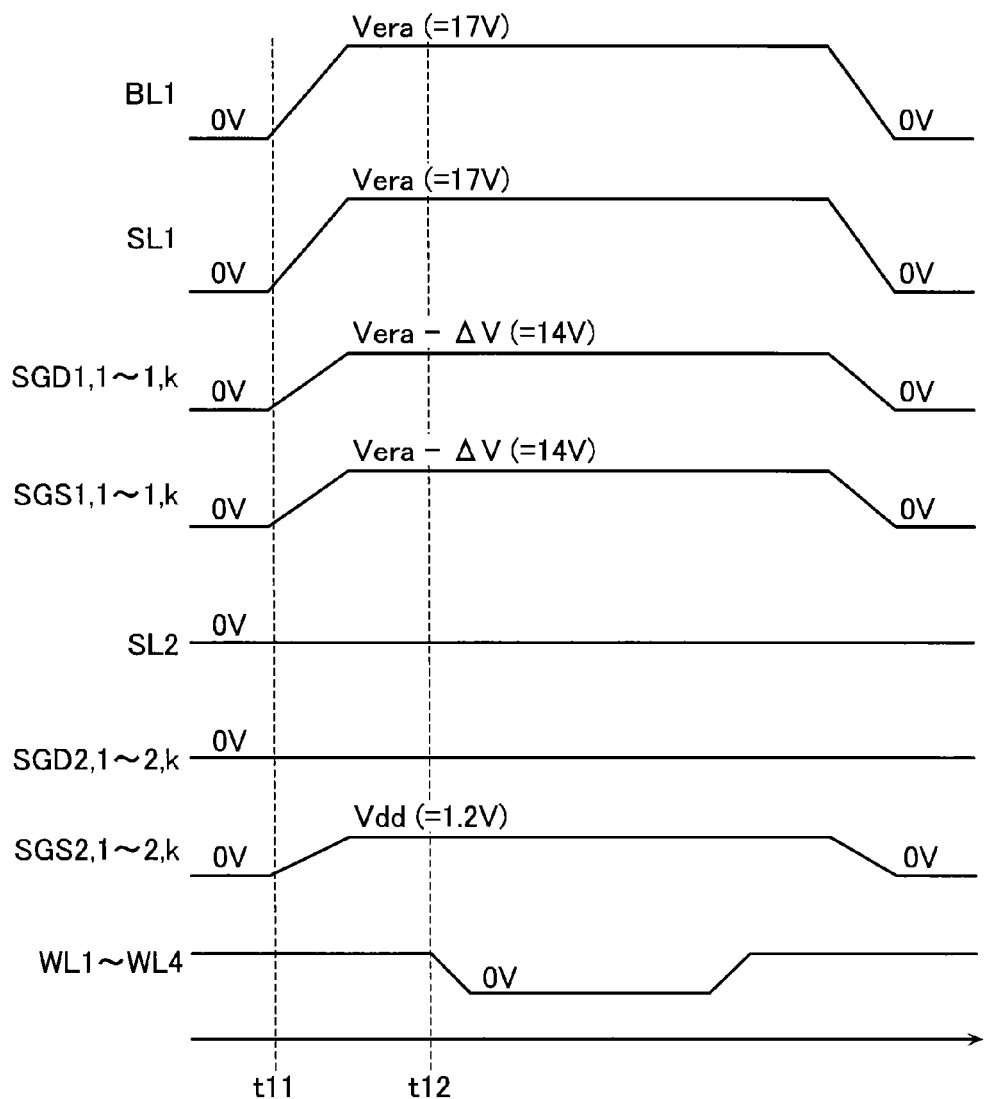

NONVOLATILE SEMICONDUCTOR MEMORY DEVICE

CROSS-REFERENCE TO RELATED APPLICATIONS

This application is a continuation of and claims the benefit of priority under 35 U.S.C. §120 from U.S. Ser. No. 13/041,579 filed Mar. 7, 2011, and claims the benefit of priority under 35 U.S.C. §119 from Japanese Patent Application No. 2010-211326 filed Sep. 21, 2010, the entire contents of each of which are incorporated herein by reference.

FIELD

Embodiments described in this specification relate to an electrically data-rewritable nonvolatile semiconductor memory device.

BACKGROUND

In recent years, many semiconductor memory devices having memory cells disposed three-dimensionally are proposed in order to increase the degree of integration of memory. For example, a semiconductor memory device employing transistors of a circular cylindrical type structure represents one such conventional semiconductor memory device having memory cells disposed three-dimensionally.

There is a risk that, when an erase operation is executed on such an above-described semiconductor memory device, the erase operation is not executed accurately due to the leak current flowing into the memory cells from various wirings.

BRIEF DESCRIPTION OF THE DRAWINGS

FIG. 6 is a schematic view of during a first erase operation in the nonvolatile semiconductor memory device in accordance with the first embodiment.

FIG. 7 is a timing chart of during the first erase operation in the nonvolatile semiconductor memory device in accordance with the first embodiment.

DETAILED DESCRIPTION

Figure 1:
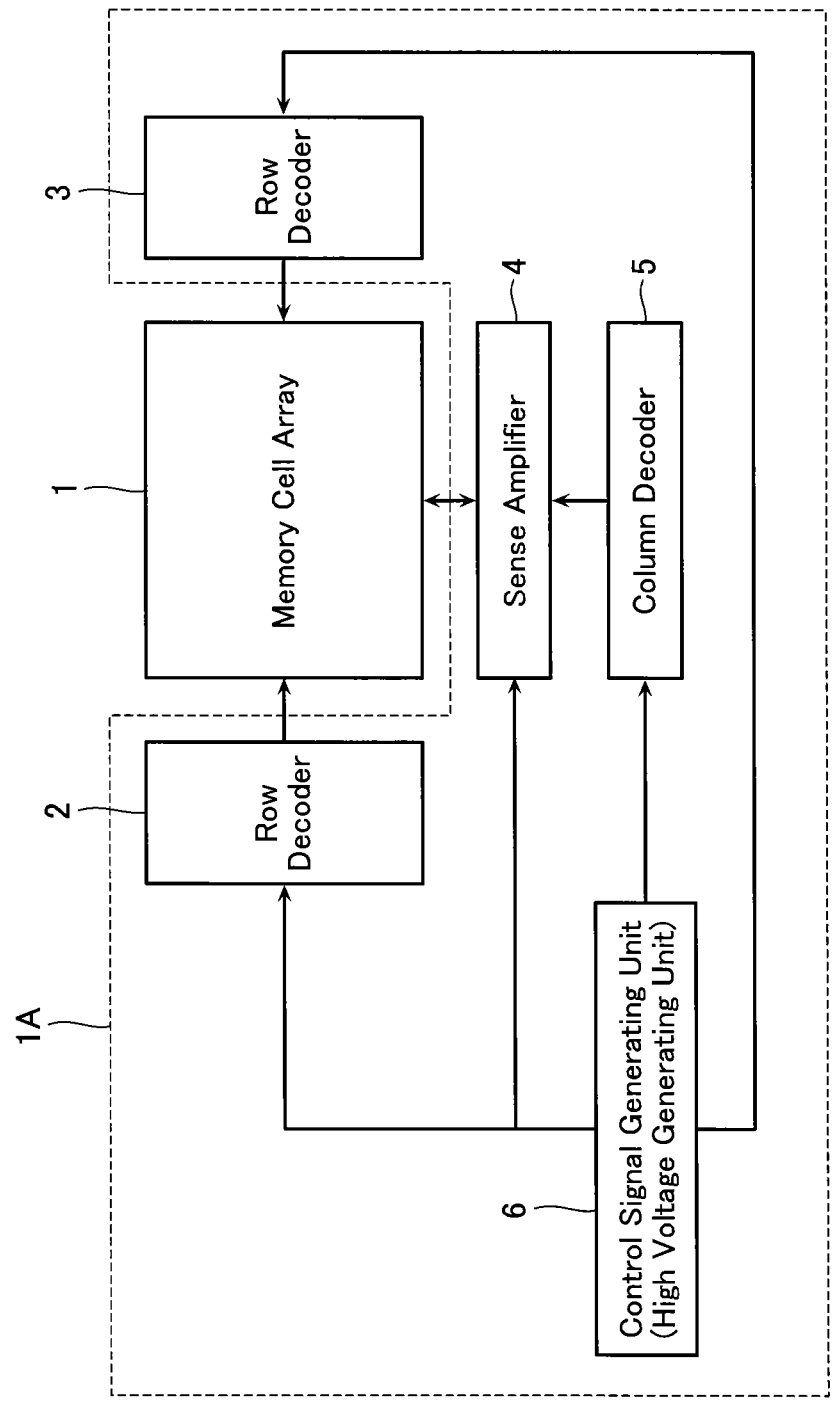
FIG. 1 is a block diagram of a nonvolatile semiconductor memory device in accordance with a first embodiment.

A nonvolatile semiconductor memory device in accordance with an embodiment comprises a plurality of memory blocks, a first line, a second line, and a control circuit. Each of the plurality of memory blocks includes a plurality of cell units and is configured as a smallest unit of an erase operation. The first line is provided commonly to the plurality of memory blocks and is connected to one ends of the plurality of cell units. The second line is connected to the other ends of the plurality of cell units. The control circuit is configured to control a voltage applied to the plurality of memory blocks. Each of the plurality of cell units comprises a memory string, a first transistor, a second transistor, and a diode. The memory string is configured by a plurality of memory transistors connected in series, the memory transistors being electrically rewritable. The first transistor has one end connected to one end of the memory string. The second transistor is provided between the other end of the memory string and the second line. The diode is provided between the first transistor and the first line and has a forward bias direction from a side of the first transistor to a side of the first line. The memory string comprises a first semiconductor layer, a charge storage layer, and a first conductive layer. The first semiconductor layer includes a columnar portion extending in a perpendicular direction with respect to a substrate and is configured to function as a body of the memory transistors. The charge storage layer is formed to surround a side surface of the columnar portion and is configured to be capable of storing charge. The first conductive layer is formed commonly in the plurality of memory blocks to surround the side surface of the columnar portion with the charge storage layer interposed therebetween and is configured to function as a gate of the memory transistors. The diode comprises a second semiconductor layer and a third semiconductor layer. The second semiconductor layer is configured as a first conductivity type extending in the perpendicular direction with respect to the substrate. The third semiconductor layer is configured as a second conductivity type being in contact with an upper surface of the second semiconductor layer and extending in the perpendicular direction with respect to the substrate. The control circuit is configured to perform the erase operation in a selected one of the memory blocks by setting a voltage of the first line higher than a voltage of a gate of the first transistor by a first voltage to generate a GIDL current for raising a voltage of the body of the memory transistors, and setting a voltage of the gate of the memory transistors lower than the voltage of the body of the memory transistors by a second voltage. On the other hand, the control circuit is configured to prohibit the erase operation in an unselected one of the memory blocks by setting a voltage difference between the voltage of the first line and the voltage of the gate of the first transistor to a third voltage different from the first voltage for prohibiting generation of the GIDL current.

A nonvolatile semiconductor memory device in accordance with another embodiment comprises a plurality of memory blocks, a first line, a second line, and a control circuit. Each of the memory blocks is configured as an arrangement of a plurality of cell units and is configured as a smallest unit of an erase operation. The first line is provided commonly to the plurality of memory blocks and is connected to one ends of the plurality of cell units. The second line is connected to the other ends of the plurality of cell units. The control circuit is configured to control a voltage applied to the plurality of memory blocks. Each of the plurality of cell units comprises a memory string, a first transistor, a second transistor, and a diode. The memory string is configured by a plurality of memory transistors connected in series, the memory transistors being electrically rewritable. The first transistor has one end connected to one end of the memory string. The second transistor is provided between the other end of the memory string and the second line. The diode is provided between the first transistor and the first line and has a forward bias direction from a side of the first line to a side of the first transistor. The memory string comprises a first semiconductor layer, a charge storage layer, and a first conductive layer. The first semiconductor layer includes a columnar portion extending in a perpendicular direction with respect to a substrate and is configured to function as a body of the memory transistors. The charge storage layer is formed to surround a side surface of the columnar portion and is configured to be capable of storing a charge. The first conductive layer is formed commonly in the plurality of memory blocks to surround the side surface of the columnar portion with the charge storage layer interposed therebetween and is configured to function as a gate of the memory transistors. The diode comprises a second semiconductor layer and a third semiconductor layer. The second semiconductor layer is configured as a first conductivity type extending in the perpendicular direction with respect to the substrate. The third semiconductor layer is configured as a second conductivity type being in contact with the second semiconductor layer and extending in the perpendicular direction with respect to the substrate. The control circuit is configured to perform the erase operation in a selected one of the memory blocks by setting a voltage of the second line higher than a voltage of a gate of the second transistor by a first voltage to generate a GIDL current for raising a voltage of the body of the memory transistors, and setting a voltage of the gate of the memory transistors lower than the voltage of the body of the memory transistors by a second voltage. On the other hand, the control circuit is configured to prohibit the erase operation in an unselected one of the memory blocks by setting a voltage difference between the voltage of the second line and the voltage of the gate of the second transistor to a third voltage different from the first voltage for prohibiting generation of the GIDL current.

Next, embodiments of a nonvolatile semiconductor memory device are described with reference to the drawings.

[First Embodiment]

[Configuration]

First, a configuration of a nonvolatile semiconductor memory device in accordance with a first embodiment is described with reference to FIGS. 1 and 2. FIG. 1 is a block diagram of the nonvolatile semiconductor memory device in accordance with the first embodiment of the present invention, and FIG. 2 is a schematic perspective view of the nonvolatile semiconductor memory device in accordance with the first embodiment of the present invention.

The nonvolatile semiconductor memory device in accordance with the first embodiment includes a memory cell array 1 and a control circuit 1A, as shown in FIG. 1.

Figure 2:
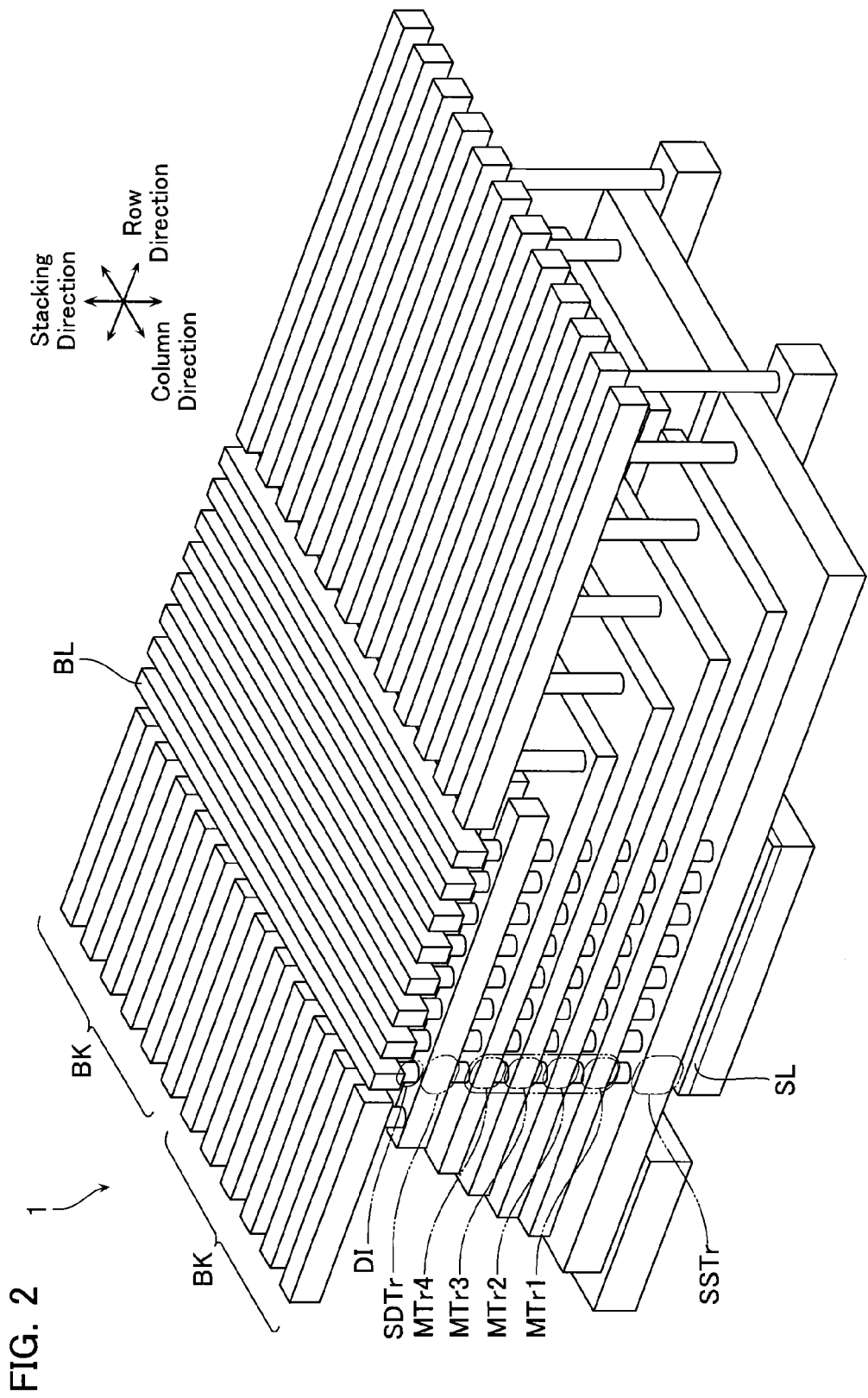
FIG. 2 is a schematic perspective view of the nonvolatile semiconductor memory device in accordance with the first embodiment.

The memory cell array 1 is configured by memory transistors MTr1-MTr4 arranged in a three-dimensional matrix, each of the memory transistors being configured to store data electrically, as shown in FIG. 2. That is, the memory transistors MTr1-MTr4, in addition to being arranged in a matrix in a horizontal direction, are arranged also in a stacking direction (perpendicular direction with respect to a substrate).

A plurality of the memory transistors MTr1-MTr4 aligned in the stacking direction are connected in series to configure a publicly known memory string MS (NAND string). Changing an amount of charge stored in a charge storage layer of the memory transistors MTr1-MTr4 causes a threshold voltage of the memory transistors MTr1-MTr4 to change. Changing the threshold voltage causes data retained in the memory transistors MTr1-MTr4 to be rewritten. Connected respectively one each to the two ends of the memory string MS are a drain side select transistor SDTr and a source side select transistor SSTr which are turned on when the memory string MS is selected. Moreover, the drain side select transistor SDTr has its drain connected via a diode DI to a bit line BL, and the source side select transistor SSTr has its source connected to a source line SL. Note that specific circuit configurations and stacking structure of the memory cell array 1 are described later.

The control circuit 1A is configured to control a voltage applied to the memory cell array 1 (memory block BK to be described later). The control circuit 1A comprises row decoders 2 and 3, a sense amplifier 4, a column decoder 5, and a control signal generating unit (high voltage generating unit) 6. The row decoders 2 and 3 decode downloaded block address signals and so on to control the memory cell array 1. The sense amplifier 4 reads data from the memory cell array 1. The column decoder 5 decodes a column address signal to control the sense amplifier 4. The control signal generating unit 6 boosts a reference voltage to generate a high voltage required during write and erase, and, moreover, generates a control signal to control the row decoders 2 and 3, the sense amplifier 4, and the column decoder 5.

Figure 3:
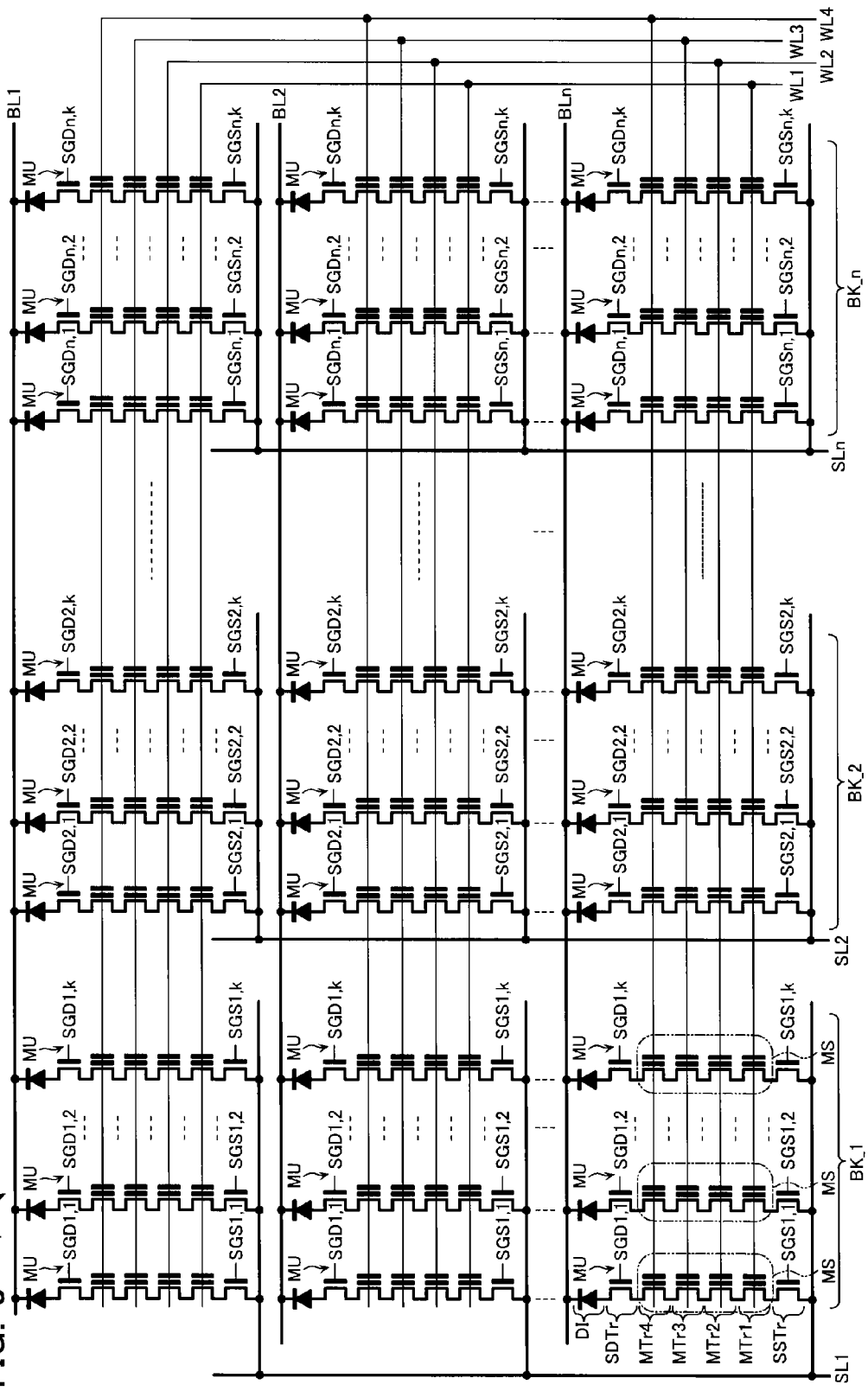
FIG. 3 is a circuit diagram of a memory cell array 1 in accordance with the first embodiment.

Next, a circuit configuration of the memory cell array 1 is described with reference to FIG. 3. As shown in FIG. 3, the memory cell array 1 includes a plurality of memory blocks BK_1, BK_2, . . . , BK_n, a plurality of bit lines BL1, BL2, . . . , BLn, and a plurality of source lines SL1, SL2, . . . , SLn. Note that memory blocks are sometimes collectively referred to as memory block BK, instead of specifying either one of BK_1, BK_2, . . . , BK_n. Bit lines are sometimes collectively referred to as bit line BL, instead of specifying either one of BL1, BL2, . . . , BLn. Source lines are sometimes collectively referred to as source line SL, instead of specifying either one of SL1, SL2, . . . , SLn.

Each of the memory blocks BK includes a plurality of cell units MU and is configured as a smallest unit of an erase operation for erasing data. Each of the bit lines BL is provided commonly to the memory blocks BK_1, BK_2, . . . , BK_n. Each of the bit lines BL is connected to drains of a plurality of the cell units MU. Each of the source lines SL is provided divided on a memory block BK basis. Each of the source lines SL is connected commonly to sources of a plurality of cell units MU in one memory block BK.

In the example shown in FIG. 3, each one of the memory blocks BK has the cell units MU provided in a matrix over k rows and n columns. Each of the cell units MU includes the memory string MS, the drain side select transistor SDTr, the source side select transistor SSTr, and the diode DI. The memory string MS is configured by the memory transistors MTr1-MTr4 connected in series. The drain side select transistor SDTr is connected to a drain of the memory string MS (drain of the memory transistor MTr4). The source side select transistor SSTr is connected to a source of the memory string MS (source of the memory transistor MTr1). Note that the memory string MS may be configured by more than four memory transistors.

As shown in FIG. 3, the memory transistors MTr1 arranged in a matrix in the plurality of memory blocks BK have their gates connected commonly to a word line WL1. Similarly, the memory transistors MTr2-MTr4 have their gates commonly connected to word lines WL2-WL4, respectively.

As shown in FIG. 3, the drain side select transistors SDTr arranged in a line in a row direction in the memory block BK_1 have their gates connected commonly to one drain side select gate line SGD1,1 (or SGD1,2, . . . , SGD1,k). Similarly, the drain side select transistors SDTr arranged in a line in the row direction in the memory block BK_2 have their gates connected commonly to one drain side select gate line SGD2,1 (or SGD2,2, . . . , SGD2,k). The drain side select transistors SDTr arranged in a line in the row direction in the memory block BK_n have their gates connected commonly to one drain side select gate line SGDn,1 (or SGDn,2, . . . , SGDn,k). Note that drain side select gate lines are sometimes collectively referred to as drain side select gate lines SGD, instead of specifying either one of SGD1,1, . . . , SGDn,k. The drain side select gate lines SGD are each provided to extend in the row direction and having a certain pitch in a column direction.

In addition, the drain side select transistors SDTr arranged in a line in the column direction have their other ends connected commonly via a respective diode DI to one bit line BL1 (or BL2, . . . , BLn). The diode DI is provided to have a forward bias direction from a side of the drain side select transistor SDTr to a side of the bit line BL. The bit line BL is formed to extend in the column direction straddling the memory blocks BK.

As shown in FIG. 3, the source side select transistors SSTr arranged in a line in the row direction in the memory block BK_1 have their gates connected commonly to one source side select gate line SGS1,1 (or SGS1,2, . . . , SGS1,k). Similarly, the source side select transistors SSTr arranged in a line in the row direction in the memory block BK_2 have their gates connected commonly to one source side select gate line SGS2,1 (or SGS2,2, . . . , SGS2,k). The source side select transistors SSTr arranged in a line in the row direction in the memory block BK_n have their gates connected commonly to one source side select gate line SGSn,1 (or SGSn,2, . . . , SGSn,k). Note that source side select gate lines are sometimes collectively referred to as source side select gate lines SGS, instead of specifying either one of SGS1,1, . . . , SGSn,k. The source side select gate lines SGS are each provided to extend in the row direction and having a certain pitch in the column direction.

In addition, all the source side select transistors SSTr in the memory block BK_1 are connected commonly to one source line SL1. Similarly, all the source side select transistors SSTr in the memory block BK_2 are connected commonly to one source line SL2, and all the source side select transistors SSTr in the memory block BK_n are connected commonly to one source line SLn.

Figure 4A:
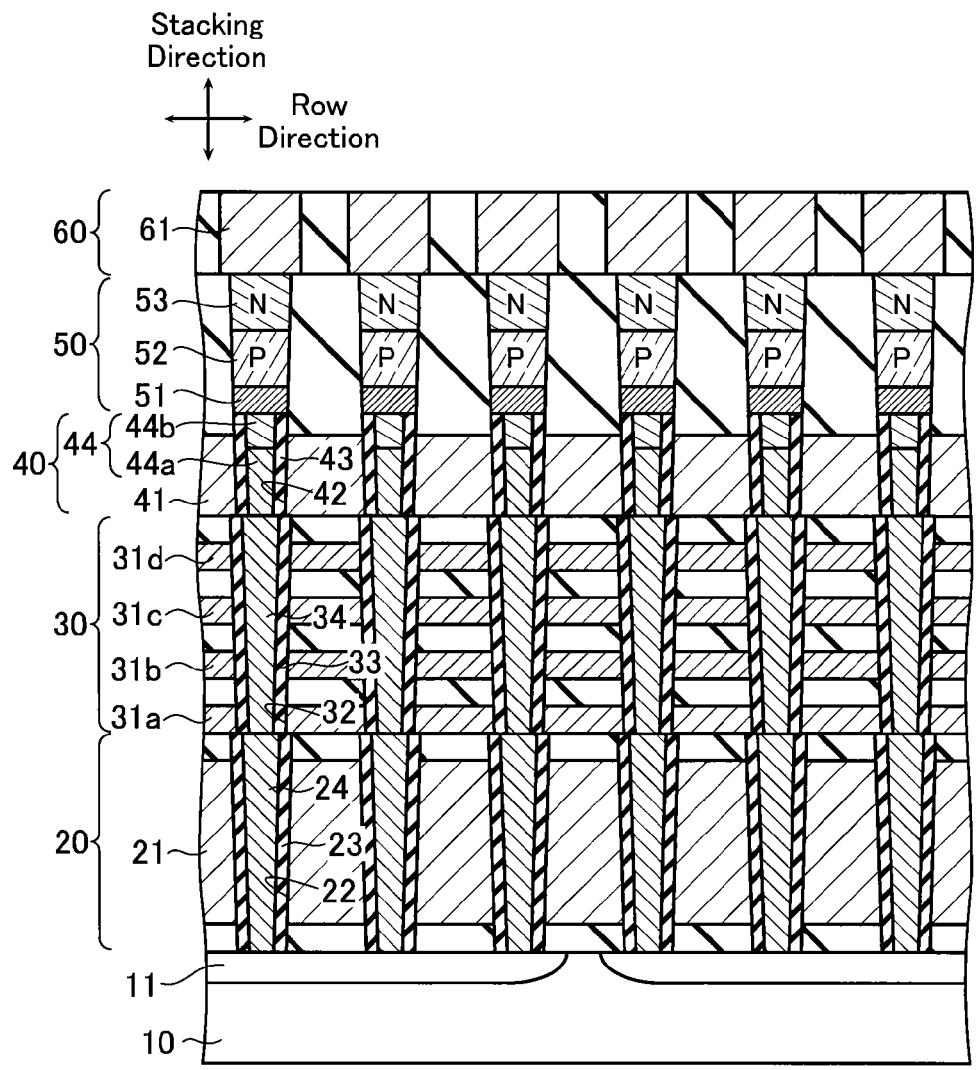
FIG. 4A is a cross-sectional view of the nonvolatile semiconductor memory device in accordance with the first embodiment.
Figure 4B:
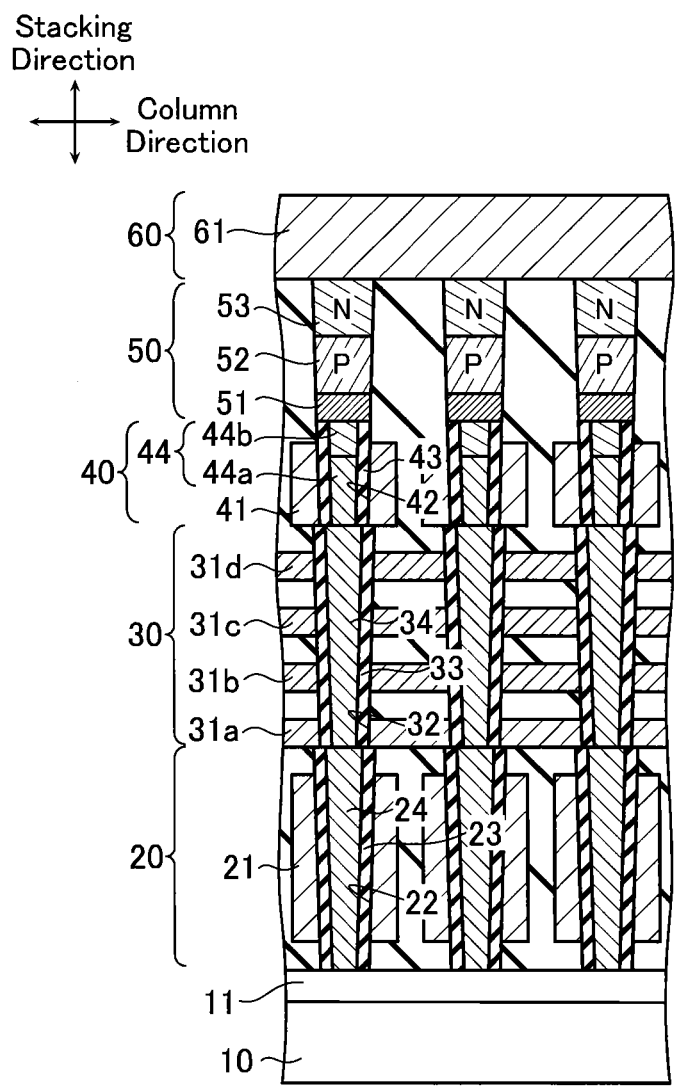
FIG. 4B is a cross-sectional view of the nonvolatile semiconductor memory device in accordance with the first embodiment.

The above-described circuit configuration of the nonvolatile semiconductor memory device is realized by a stacking structure shown in FIGS. 4A and 4B. As shown in FIGS. 4A and 4B, the nonvolatile semiconductor memory device in accordance with the first embodiment includes a semiconductor substrate 10, and, stacked sequentially on the semiconductor substrate 10, a source side select transistor layer 20, a memory transistor layer 30, a drain side select transistor layer 40, a diode layer 50, and a wiring layer 60.

The semiconductor substrate 10 functions as the source line SL. The source side select transistor layer 20 functions as the source side select transistor SSTr. The memory transistor layer 30 functions as the memory string MS (memory transistors MTr1-MTr4). The drain side select transistor layer 40 functions as the drain side select transistor SDTr. The diode layer 50 functions as the diode DI. The wiring layer 60 functions as the bit line BL and as various other wirings.

The semiconductor substrate 10 includes a diffusion layer 11 in its upper surface, as shown in FIGS. 4A and 4B. The diffusion layer 11 functions as the source line SL. The diffusion layer 11 is divided on a memory block BK basis.

The source side select transistor layer 20 includes a source side conductive layer 21 disposed on the semiconductor substrate 10 via an insulating layer, as shown in FIGS. 4A and 4B. The source side conductive layer 21 functions as the gate of the source side select transistor SSTr and as the source side select gate line SGS. The source side conductive layer 21 is formed in stripes in each of the memory blocks MB, the stripes extending in the row direction and having a certain pitch in the column direction. The source side conductive layer 21 is configured by polysilicon (poly-Si).

In addition, as shown in FIGS. 4A and 4B, the source side select transistor layer 20 includes a source side hole 22. The source side hole 22 is formed to penetrate the source side conductive layer 21. The source side holes 22 are formed in a matrix in the row direction and the column direction.

Moreover, as shown in FIGS. 4A and 4B, the source side select transistor layer 20 includes a source side gate insulating layer 23 and a source side columnar semiconductor layer 24. The source side columnar semiconductor layer 24 functions as a body (channel) of the source side select transistor SSTr.

The source side gate insulating layer 23 is formed with a certain thickness on a side wall of the source side hole 22. The source side columnar semiconductor layer 24 is formed to be in contact with a side surface of the source side gate insulating layer 23 and to fill the source side hole 22. The source side columnar semiconductor layer 24 is formed in a column shape extending in the stacking direction (perpendicular direction with respect to the semiconductor substrate 10). The source side columnar semiconductor layer 24 is formed on the diffusion layer 11. The source side gate insulating layer 23 is configured by silicon oxide ($SiO_2$). The source side columnar semiconductor layer 24 is configured by polysilicon (poly-Si).

Expressing the above-described configuration of the source side select transistor layer 20 in other words, the source side conductive layer 21 is formed to surround the source side columnar semiconductor layer 24 with the source side gate insulating layer 23 interposed therebetween.

The memory transistor layer 30 includes word line conductive layers 31a-31d stacked sequentially on the source side select transistor layer 20 with insulating layers interposed therebetween, as shown in FIGS. 4A and 4B. The word line conductive layers 31a-31d function, respectively, as the gates of the memory transistors MTr1-MTr4 and as the word lines WL1-WL4.

The word line conductive layers 31a-31d are formed to extend two-dimensionally in the row direction and the column direction (in a plate-like shape) over the plurality of memory blocks BK. The word line conductive layers 31a-31d are configured by polysilicon (poly-Si).

In addition, as shown in FIGS. 4A and 4B, the memory transistor layer 30 includes a memory hole 32. The memory hole 32 is formed to penetrate the word line conductive layers 31a-31d. The memory holes 32 are formed in a matrix in the row direction and the column direction. The memory hole 32 is formed at a position aligning with the source side hole 22.

Further, as shown in FIGS. 4A and 4B, the memory transistor layer 30 includes a memory gate insulating layer 33 and a memory columnar semiconductor layer 34. The memory columnar semiconductor layer 34 functions as a body (channel) of the memory transistors MTr1-MTr4.

The memory gate insulating layer 33 is formed with a certain thickness on a side wall of the memory hole 32. The memory columnar semiconductor layer 34 is formed to be in contact with a side surface of the memory gate insulating layer 33 and to fill the memory hole 32. The memory columnar semiconductor layer 34 is formed in a column shape extending in the stacking direction. The memory columnar semiconductor layer 34 is formed having its lower surface in contact with an upper surface of the source side columnar semiconductor layer 24.

Figure 5:
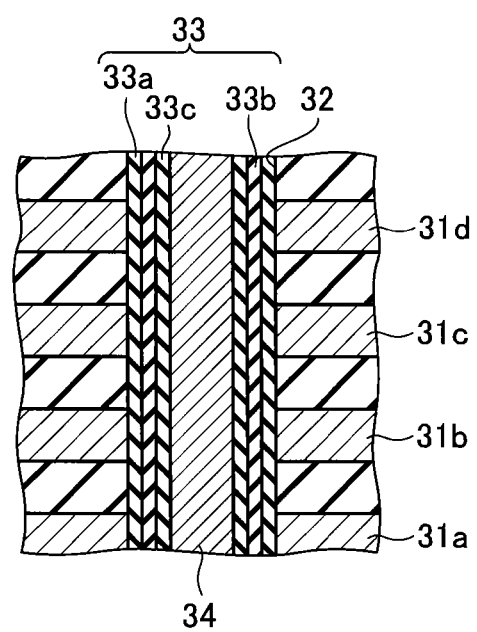
FIG. 5 is an enlarged view of FIG. 4A.

A configuration of the memory gate insulating layer 33 is now described in detail with reference to FIG. 5. FIG. 5 is an enlarged view of FIG. 4A. The memory gate insulating layer 33 includes, from a side surface of the memory hole 32 side to a memory columnar semiconductor layer 34 side, a block insulating layer 33a, a charge storage layer 33b, and a tunnel insulating layer 33c. The charge storage layer 33b is configured to be capable of storing a charge.

As shown in FIG. 5, the block insulating layer 33a is formed with a certain thickness on a side wall of the memory hole 32. The charge storage layer 33b is formed with a certain thickness on a side wall of the block insulating layer 33a. The tunnel insulating layer 33c is formed with a certain thickness on a side wall of the charge storage layer 33b. The block insulating layer 33a and the tunnel insulating layer 33c are configured by silicon oxide ($SiO_2$). The charge storage layer 33b is configured by silicon nitride (SiN). The memory columnar semiconductor layer 34 is configured by polysilicon (poly-Si).

Expressing the above-described configuration of the memory transistor layer 30 in other words, the word line conductive layers 31a-31d are formed to surround the memory columnar semiconductor layer 34 with the memory gate insulating layer 33 interposed therebetween.

The drain side select transistor layer 40 includes a drain side conductive layer 41, as shown in FIGS. 4A and 4B. The drain side conductive layer 41 functions as the gate of the drain side select transistor SDTr and as the drain side select gate line SGD.

The drain side conductive layer 41 is stacked on the memory transistor layer 30 via an insulating layer. The drain side conductive layer 41 is formed directly above the memory columnar semiconductor layer 34. The drain side conductive layer 41 is formed in stripes in each of the memory blocks BK, the stripes extending in the row direction and having a certain pitch in the column direction. The drain side conductive layer 41 is configured by, for example, polysilicon (poly-Si).

In addition, as shown in FIGS. 4A and 4B, the drain side select transistor layer 40 includes a drain side hole 42. The drain side hole 42 is formed to penetrate the drain side conductive layer 41. The drain side holes 42 are formed in a matrix in the row direction and the column direction. The drain side hole 42 is formed at a position aligning with the memory hole 32.

Further, as shown in FIGS. 4A and 4B, the drain side select transistor layer 40 includes a drain side gate insulating layer 43 and a drain side columnar semiconductor layer 44. The drain side columnar semiconductor layer 44 functions as a body (channel) of the drain side select transistor SDTr.

The drain side gate insulating layer 43 is formed with a certain thickness on a side wall of the drain side hole 42. The drain side columnar semiconductor layer 44 is formed to be in contact with the drain side gate insulating layer 43 and to fill the drain side hole 42. The drain side columnar semiconductor layer 44 is formed in a column shape to extend in the stacking direction. The drain side columnar semiconductor layer 44 is formed having its lower surface in contact with an upper surface of the memory columnar semiconductor layer 34. The drain side gate insulating layer 43 is configured by silicon oxide (SiO$_2$). The drain side columnar semiconductor layer 44 is configured by polysilicon (poly-Si). Moreover, the drain side columnar semiconductor layer 44 has its lower portion 44a configured by an intrinsic semiconductor and its upper portion 44b configured by an N+ type semiconductor.

Expressing the above-described configuration of the drain side select transistor layer 40 in other words, the drain side conductive layer 41 is formed to surround the drain side columnar semiconductor layer 44 with the drain side gate insulating layer 43 interposed therebetween.

The diode layer 50 includes an ohmic contact layer 51, a P type semiconductor layer 52, and an N type semiconductor layer 53, as shown in FIGS. 4A and 4B. The ohmic contact layer 51 causes ohmic contact between the P type semiconductor layer 52 and the drain side columnar semiconductor layer 44. The P type semiconductor layer 52 and the N type semiconductor layer 53 function as the diode DI.

The ohmic contact layer 51 is formed in a column shape extending in the stacking direction from an upper surface of the drain side columnar semiconductor layer 44. The P type semiconductor layer 52 is formed in a column shape extending in the stacking direction from an upper surface of the ohmic contact layer 51. The N type semiconductor layer 53 is formed in a column shape extending in the stacking direction from an upper surface of the P type semiconductor layer 52. The P type semiconductor layer 52 is configured by polysilicon doped with a P type impurity. The N type semiconductor layer 53 is configured by polysilicon doped with an N type impurity.

The wiring layer 60 includes a bit layer 61, as shown in FIGS. 4A and 4B. The bit layer 61 functions as the bit line BL.

The bit layer 61 is formed to be in contact with an upper surface of the N type semiconductor layer 53. The bit layer 61 is formed to extend in the column direction and having a certain pitch in the row direction. The bit layer 61 is configured by a metal such as tungsten.

[First Erase Operation]

Next, a first erase operation in the nonvolatile semiconductor memory device in accordance with the first embodiment is described with reference to FIG. 6.

In the example shown in FIG. 6, memory block BK_1 is assumed to be selected as object of the erase operation. On the other hand, memory block BK_2, which shares bit lines BL with memory block BK_1, is not an object of the erase operation, and erase of data retained in memory block BK_2 is prohibited.

During the erase operation, a voltage Vera (for example, about 17 V) is applied to bit line BL1. In selected memory block BK_1, source line SL1 is applied with voltage Vera, and drain side select gate lines SGD and source side select gate lines SGS are applied with a voltage Vera-ΔV that is smaller than voltage Vera by ΔV (for example, about 3 V). On the other hand, in unselected memory block BK_2, source line SL2 is applied with 0 V, and drain side select gate lines SGD and source side select gate lines SGS are applied, respectively, with 0 V and a power supply voltage Vdd (=1.2 V).

Specifically, as shown in FIG. 6, in selected memory block BK_1, voltage Vera of bit line BL1 is higher than voltage Vera-ΔV of gates of drain side select transistors SDTr by an the voltage ΔV. In addition, voltage Vera of source line SL1 is higher than voltage Vera-ΔV of gates of source side select transistors SSTr by the voltage ΔV. This causes a GIDL current (refer to symbol "E11") to occur proximal to gates of source side select transistors SSTr and drain side select transistors SDTr in memory block BK_1. Moreover, in memory block BK_1, holes caused by the GIDL current flow into the body of memory transistors MTr1-MTr4, causing a voltage of the body of memory transistors MTr1-MTr4 to rise.

Subsequently, a voltage of the gates of the memory transistors MTr1-MTr4 is set to 0 V, in other words, is set lower than the voltage of the body of memory transistors MTr1-MTr4. As a result, a high voltage is applied to the charge storage layer of memory transistors MTr1-MTr4, whereby the erase operation on memory block BK_1 is executed.

On the other hand, in memory block BK_2, a voltage of gates of the drain side select transistors SDTr is set to 0 V. That is, a voltage Vera of bit line BL1 is set higher than a voltage (0 V) of gates of the drain side select transistors SDTr by Vera. In addition, source line SL2 is set to 0 V, a voltage of gates of the source side select transistors SSTr is set to the power supply voltage Vdd (for example, 1.2 V). That is, a voltage (Vdd) of gates of the source side select transistors SSTr is set higher than a voltage (0 V) of source line SL2 by Vera. As a result, occurrence of the GIDL current is prohibited, and the source side select transistors SSTr are turned on.

Now, gates of the memory transistors MTr1-MTr4 are connected commonly between memory blocks BK_1 and BK_2 by the word lines WL1-WL4. As a result, gates of memory transistors MTr1-MTr4 have their voltage set to 0 V in memory block BK_2 as well as in memory block BK_1.

However, in memory block BK_2, the voltage of the body of memory transistors MTr1-MTr4 is not boosted by the GIDL current. Moreover, in memory block BK_2, the source side select transistors SSTr are turned on, hence, even if the voltage of the body of memory transistors MTr1-MTr4 rises due to effects of leak current and so on, that voltage is discharged to source line SL2 via those turned-on source side select transistors SSTr (refer to symbol "E12").

Furthermore, the first embodiment includes the diode DI. This may suppress a current flowing from bit line BL1 into the body of memory transistors MTr1-MTr4 in unselected memory block BK_2 (refer to symbol "E13").

As is clear from the above, in memory block BK_2, the voltage of the body of memory transistors MTr1-MTr4 is retained at low voltage. As a result, a high voltage is not applied to the charge storage layer in those memory transistors MTr1-MTr4, hence, the first embodiment may suppress incorrect erase in unselected memory block BK_2.

A specific operation procedure when executing the above-described erase operation is described with reference to a timing chart in FIG. 7. First, at time t11 in FIG. 7, the voltage of bit line BL1 and voltage of source line SL1 are raised to erase voltage Vera (for example, 17V). Additionally, at time t11, the voltage of source side select gate lines SGS1,1-SGS1,k and voltage of drain side select gate lines SGD1,1-SGD1,k are raised to voltage Vera-ΔV (for example, 14 V). This causes the GIDL current to occur in memory block BK_1.

On the other hand, at time t11, the voltage of source line SL2 is maintained at 0 V. Additionally, at time t11, the voltage of source side select gate lines SGS2,1-SGS2,k is raised to the power supply voltage Vdd, and the voltage of drain side select gate lines SGD2,1-SGD2,k is maintained at 0 V. As a result, the GIDL current does not occur in memory block BK_2, and the source side select transistors SSTr are turned on.

Next, at time t12, the voltage of word lines WL1-WL4 is lowered to 0 V. This causes data in the memory transistors MTr1-MTr4 in memory block BK_1 to be erased, and data in the memory transistors MTr1-MTr4 in memory block BK_2 to be retained (not erased).

[First Write Operation]

Next, a first write operation in the nonvolatile semiconductor memory device in accordance with the first embodiment is described with reference to FIGS. 8A and 8B.

Figure 8A:
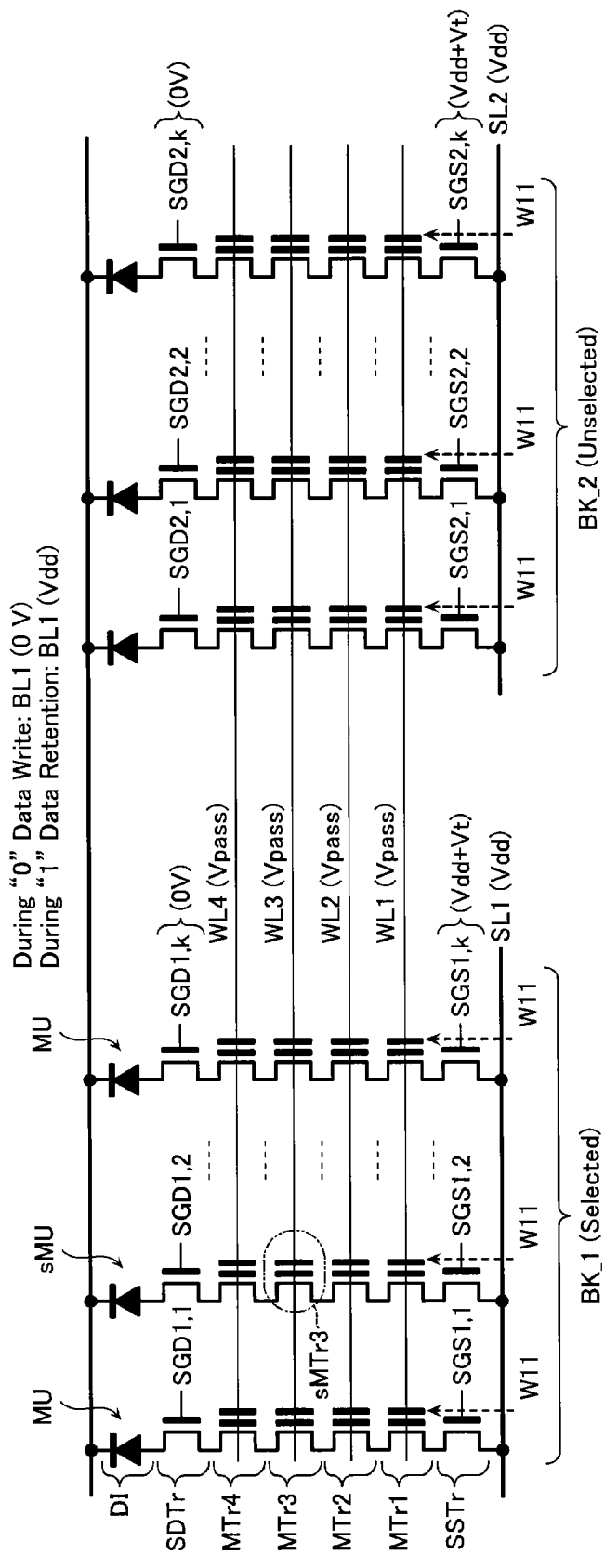
FIG. 8A is a schematic view of during a first write operation in the nonvolatile semiconductor memory device in accordance with the first embodiment.
Figure 8B:
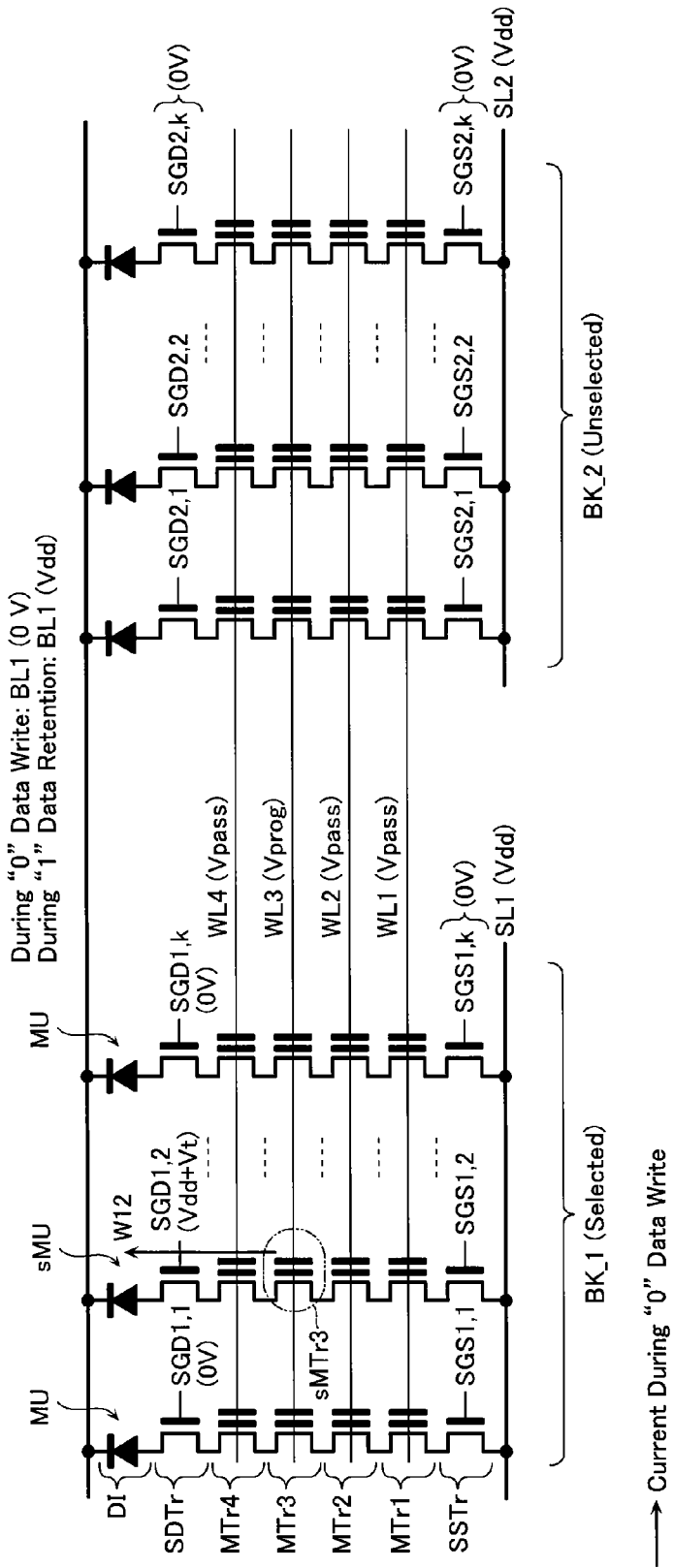
FIG. 8B is a schematic view of during the first write operation in the nonvolatile semiconductor memory device in accordance with the first embodiment.

In FIGS. 8A and 8B, an example is described of the case in which a cell unit MU (hereafter referred to as selected cell unit sMU) in memory block BK_1 is selected as write target. Description proceeds assuming write to be performed on memory transistor MTr3 (hereafter referred to as selected memory transistor sMTr3) in the selected cell unit sMU.

Specifically, as shown in FIG. 8A, in the case of writing "0" data to selected memory transistor sMTr3, the voltage of bit line BL1 is set to 0 V. In contrast, in the case of retaining "1" data in selected memory transistor sMTr3, the voltage of bit line BL1 is set to the power supply voltage Vdd (=1.2 V). Source lines SL1 and SL2 are set to the power supply voltage Vdd.

Then, the memory transistors MTr1-MTr4 included in memory blocks BK_1 and BK_2 are applied with a pass voltage Vpass (for example, 10V) at their gates and turned on. The source side select transistors SSTr are applied with a voltage Vdd+Vt at their gates and turned on. This causes the voltage of the body of the memory transistors MTr1-MTr4 included in memory blocks BK_1 and BK_2 to be charged to the power supply voltage Vdd via source lines SL1 and SL2 (refer to symbol "W11"). That is, the voltage of the body of the memory transistors MTr1-MTr4 included in memory blocks BK_1 and BK_2 is set to not less than the power supply voltage Vdd that may be applied to bit line BL1 during the write operation. Moreover, after a certain time, the source side select transistors SSTr are turned off again.

Subsequently, as shown in FIG. 8B, the drain side select transistors SDTr included in selected cell unit sMU are supplied with voltage Vdd+Vt at their gates. In the case that 0 V is supplied to bit line BL1 to write "0" data, the drain side select transistors SDTr are turned on, whereby the voltage of the body of the memory transistors MTr1-MTr4 included in selected cell unit sMU are discharged to the same 0 V as bit line BL1 (refer to symbol "W12"). On the other hand, in the case that the power supply voltage Vdd is supplied to bit line BL1 to retain "1" data, the drain side select transistors SDTr remain turned off, hence, the body of the memory transistors MTr1-MTr4 included in selected cell unit sMU is not discharged but set to a floating state, whereby its potential is retained at the power supply voltage Vdd.

Then, a voltage of the gate of selected memory transistor sMTr3 is set to a program voltage Vprg (=18 V). As a result, when writing "0" data, the voltage of the body of selected memory transistor sMTr3 is discharged to 0 V, hence, a high voltage is applied to the charge storage layer of selected memory transistor sMTr3, whereby the write operation on selected memory transistor sMTr3 is executed. On the other hand, when retaining "1" data, the body of selected memory transistor sMTr3 is set to the floating state and its potential retained at the power supply voltage Vdd, hence a high voltage is not applied to the charge storage layer of selected memory transistor sMTr3, whereby the write operation on selected memory transistor sMTr3 is not executed.

Now, gates of the memory transistors MTr1-MTr4 are connected commonly by the word lines WL1-WL4 over a plurality of the cell units MU. If the voltage of the gate of selected memory transistor sMTr3 is set to the program voltage Vprg, the gates of memory transistors MTr3 included in unselected cell units MU are also applied with the program voltage Vprg. However, the voltage of the body of memory transistors MTr1-MTr4 included in unselected cell units MU is set to the floating state by the turned-off drain side select transistors SDTr and source side select transistors SSTr. As a result, a high voltage is not applied to the charge storage layer of memory transistors MTr3 included in unselected cell units MU, whereby the write operation is not executed on those memory transistors.

Figure 9:
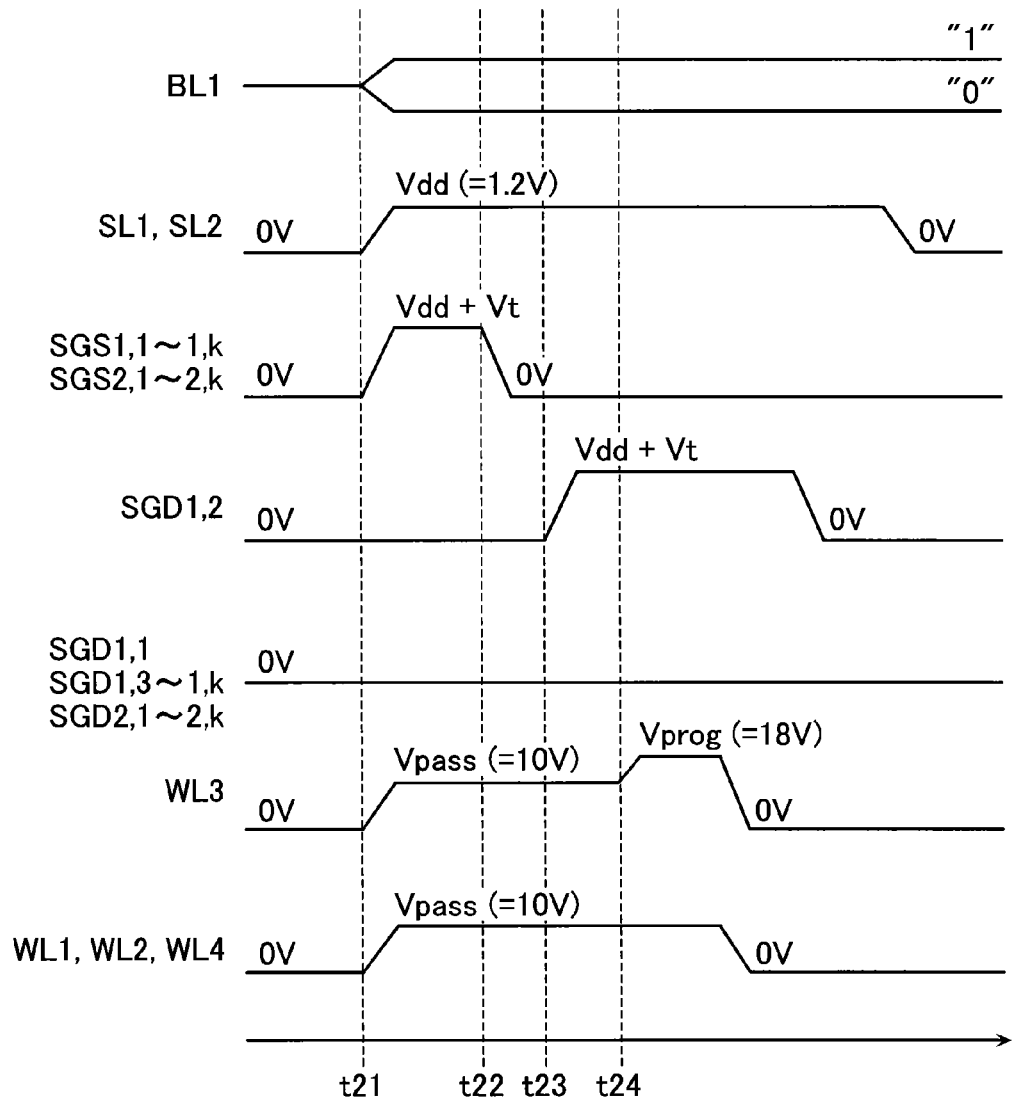
FIG. 9 is a timing chart of during the first write operation in the nonvolatile semiconductor memory device in accordance with the first embodiment.

A specific operation procedure when executing the above-described write operation is described with reference to a timing chart in FIG. 9. First, at time t21 in FIG. 9, the voltage of source lines SL1 and SL2 is raised to the power supply voltage Vdd, and the voltage of source side select gate lines SGS1,1-SGS1,$k$ and SGS2,1-SGS2,$k$ is raised to voltage Vdd+Vt. Additionally, at time t21, the voltage of word lines WL1-WL4 is raised to the pass voltage Vpass. This causes the source side select transistors SSTr in memory block BK_1 to be turned on, whereby the voltage of the body of memory transistors MTr1-MTr4 attains the power supply voltage Vdd. Further, at time t21, bit line BL1 is lowered to 0 V during a "0" data write, and is raised to the power supply voltage Vdd during a "1" data retention.

Next, at time t22, the voltage of source side select gate lines SGS1,1-SGS1,$k$ and SGS2,1-SGS2,$k$ is lowered to 0 V. This causes the source side select transistors SSTr in memory block BK_1 to be turned off.

Subsequently, at time t23, the voltage of drain side select gate line SGD1,2 is raised to voltage Vdd+Vt. This causes the drain side select transistor SDTr in selected cell unit sMU only to be turned on.

Next, at time t24, the voltage of word line WL3 is raised to program voltage Vprog (for example, 18 V). This causes the write operation on selected memory transistor sMTr3 to be executed.

[First Read Operation]

Next, a first read operation in the nonvolatile semiconductor memory device in accordance with the first embodiment is described with reference to FIG. 10. In the example shown in FIG. 10, the read operation is executed on selected memory transistor sMTr3.

Figure 10:
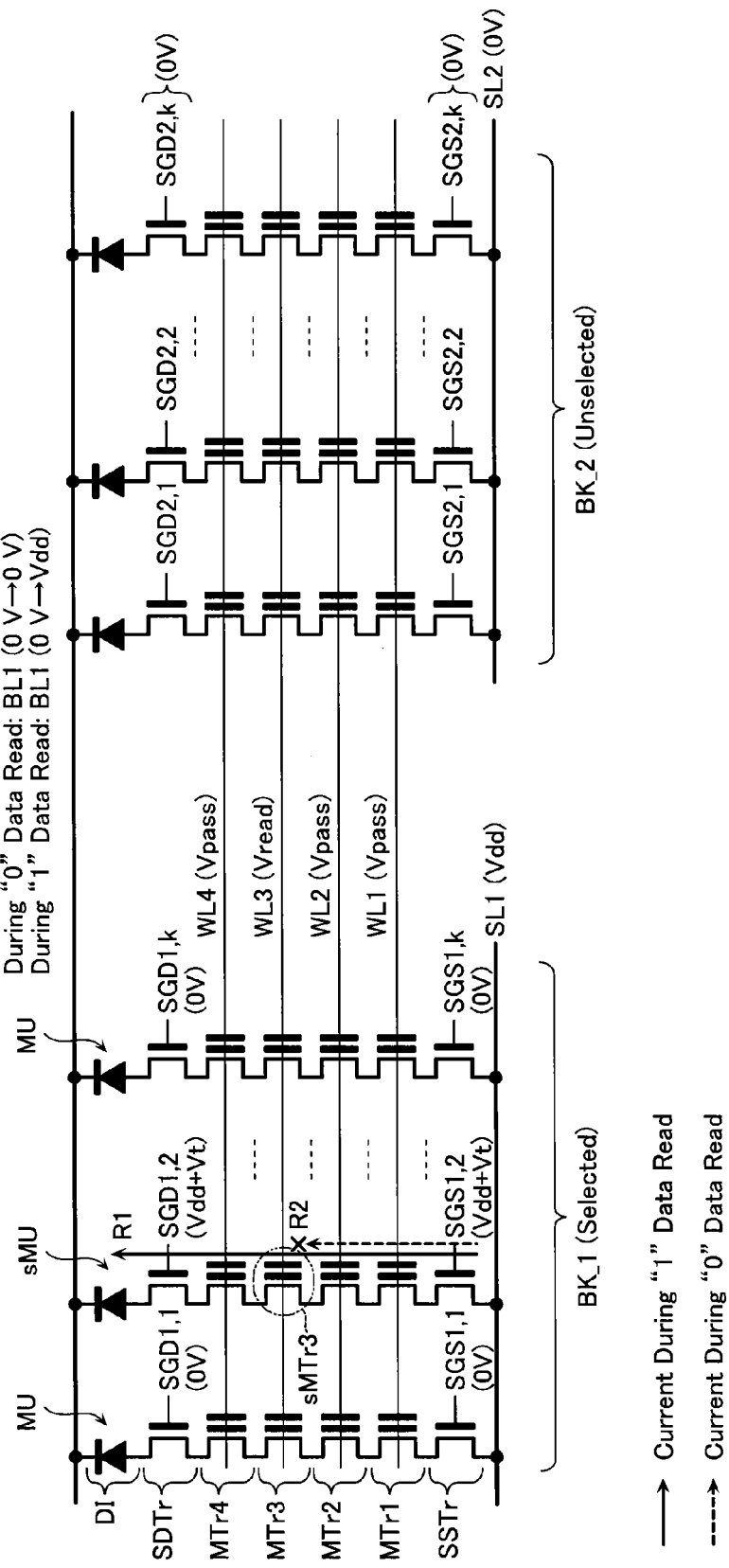
FIG. 10 is a schematic view of during a first read operation in the nonvolatile semiconductor memory device in accordance with the first embodiment.

Specifically, as shown in FIG. 10, bit line BL1 is set to 0 V. Source line SL1 is set to power supply voltage Vdd, and source line SL2 is set to 0 V. The drain side select transistors SDTr and source side select transistors SSTr included in selected cell unit sMU is applied with voltage Vdd+Vt from the select gate lines SGD1,2 and SGS1,2, and are turned on. Moreover, the gates of memory transistors MTr1, MTr2, and MTr4 are applied with pass voltage Vpass, and the gates of memory transistors MTr3 are applied with a read voltage Vread (Vread<Vpass). As a result, in the case that selected memory transistor sMTr3 is retaining "1" data, a current flows from source line SL1 to bit line BL1 (refer to symbol "R1"), whereby bit line BL1 is charged to power supply voltage Vdd. On the other hand, in the case that selected memory transistor sMTr3 is retaining "0" data (in the case that a threshold value is high), a current does not flow from source line SL1 to bit line BL1 (refer to symbol "R2"), whereby bit line BL1 is not charged but retains 0 V. Further, detection of the voltage of bit line BL1 is performed, whereby the read operation on selected memory transistor sMTr3 is executed.

Figure 11:
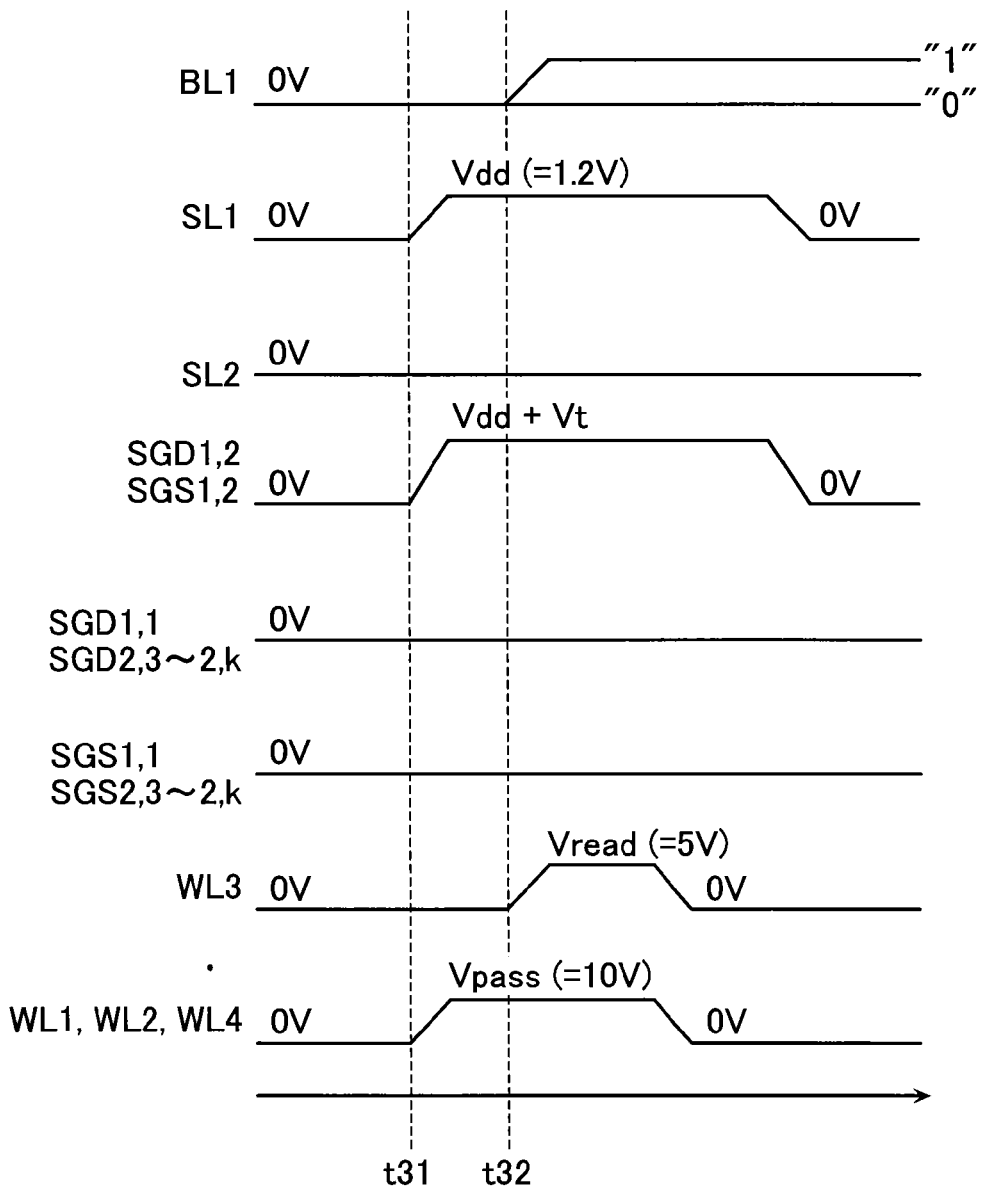
FIG. 11 is a timing chart of during the first read operation in the nonvolatile semiconductor memory device in accordance with the first embodiment.

A specific operation procedure when executing the above-described read operation is described with reference to a timing chart in FIG. 11. First, at time t31 in FIG. 11, the voltage of source line SL1 is raised to the power supply voltage Vdd, and the voltage of source side select gate line SGS1,2 and voltage of drain side select gate line SGD1,2 are raised to voltage Vdd+Vt. Additionally, at time t31, the voltage of word lines WL1, WL2, and WL4 is raised to the pass voltage Vpass. This causes the memory transistors MTr1,2,4, source side select transistors SSTr, and drain side select transistors SDTr to be turned on.

Next, at time t32, the voltage of word line WL3 is raised to the read voltage Vread. Subsequently, detection of the voltage of bit line BL1 is performed, whereby the read operation on selected memory transistor sMTr3 is executed.

[Second Erase Operation]

Figure 12:
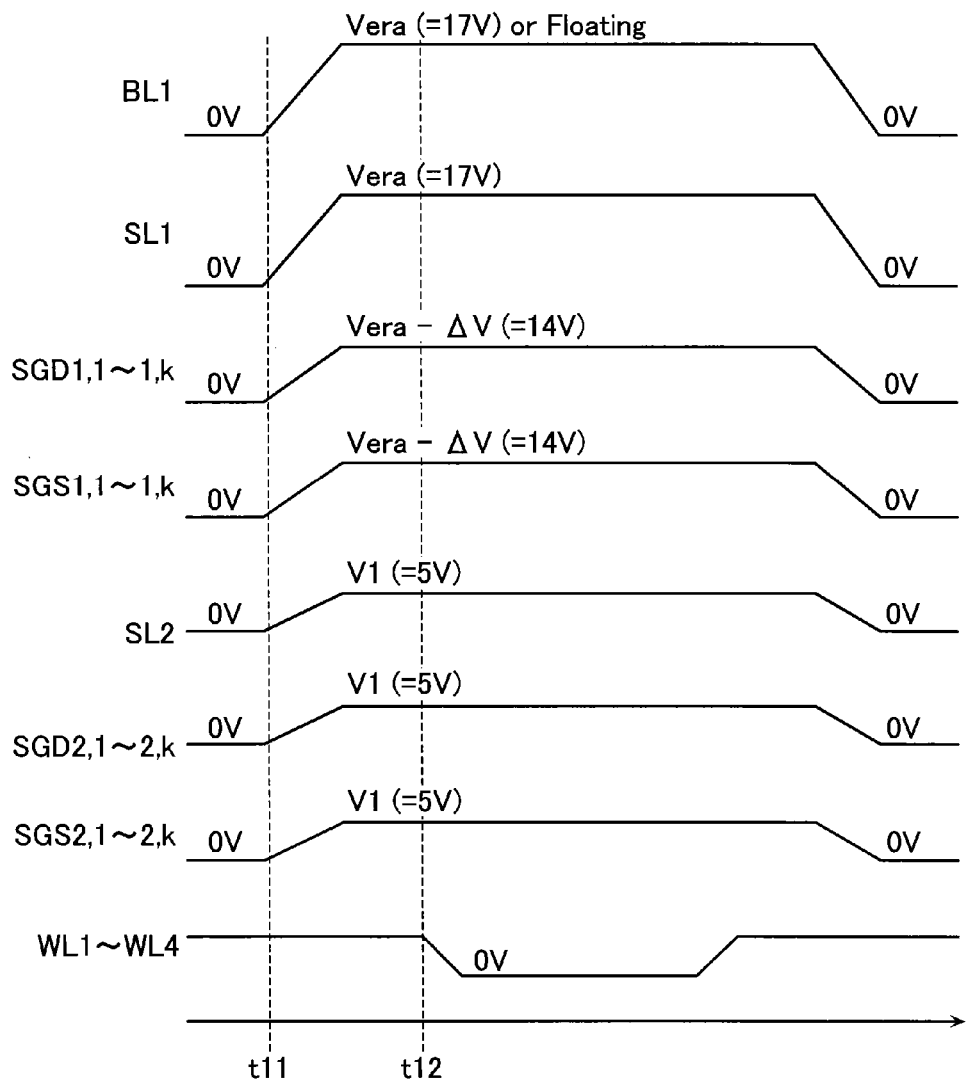
FIG. 12 is a timing chart of during a second erase operation in the nonvolatile semiconductor memory device in accordance with the first embodiment.

Next, a second erase operation in the nonvolatile semiconductor memory device in accordance with the first embodiment is described with reference to FIG. 12. As shown in FIG. 12, this second erase operation differs from the first erase operation in having source line SL2, drain side select gate lines SGD2,1-SGD2,$k$, and source side select gate lines SGS2,1-SGS2,$k$ raised to a voltage V1 (=5 V) at time t11.

The above-described voltage V1 causes a voltage applied to the gate insulating layer of source side select transistors SSTr and drain side select transistors SDTr in unselected memory block BK_2 during the above-described second erase operation to be lower than that during the first erase operation. The second erase operation therefore may suppress damage to the source side select transistors SSTr and drain side select transistors SDTr even if those transistors have a low breakdown voltage.

[Second Write Operation]

Figure 13:
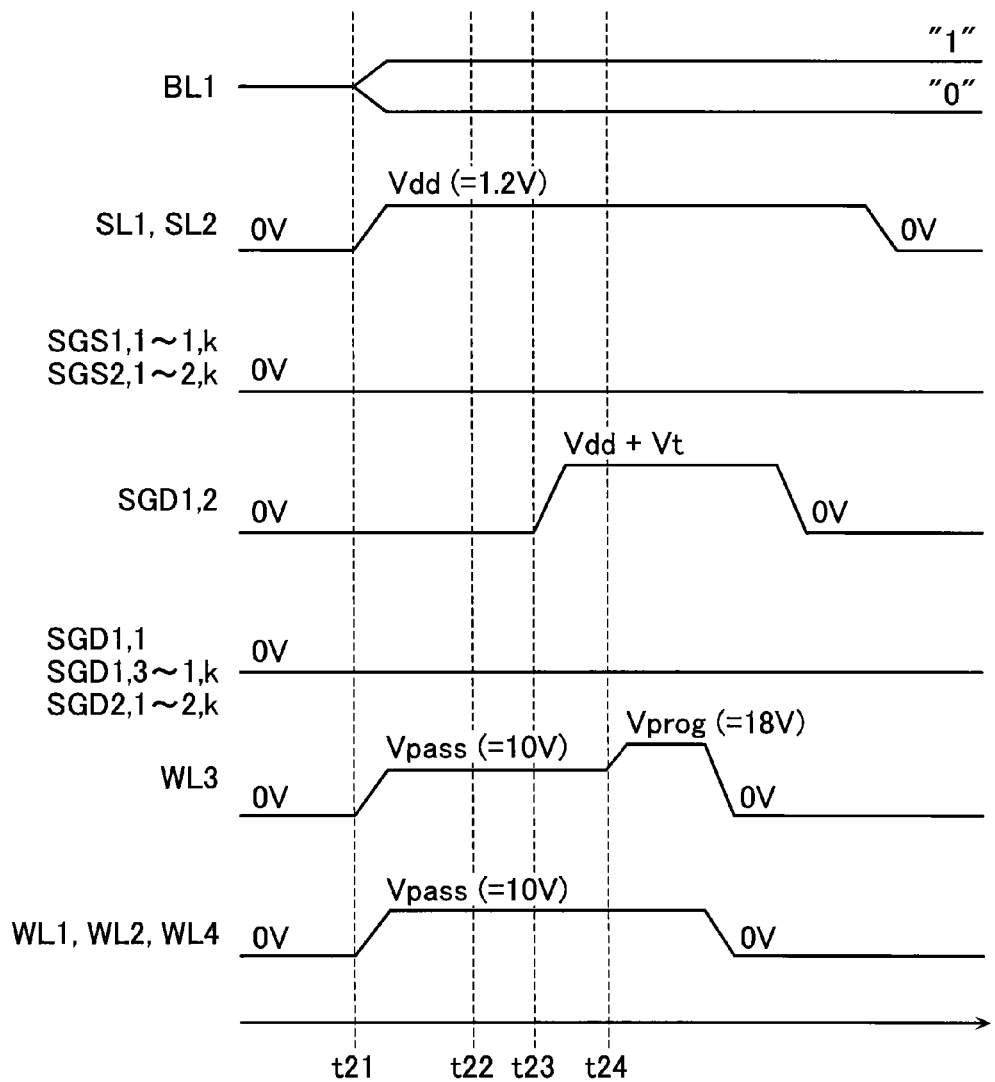
FIG. 13 is a timing chart of during a second write operation in the nonvolatile semiconductor memory device in accordance with the first embodiment.

Next, a second write operation in the nonvolatile semiconductor memory device in accordance with the first embodiment is described with reference to FIG. 13. Now, as shown by the symbol "W11" in FIG. 8A, the first write operation executes a charging process for charging the body of memory transistors MTr1-MTr4 in memory blocks BK_1 and BK_2 to the power supply voltage Vdd. In contrast, the second write operation omits from the first write operation this charging process of the body to the power supply voltage Vdd. That is, as shown in FIG. 13, in the second write operation, at time t21, the source side select gate lines SGS1,1-SGS1,$k$ and SGS2, 1-SGS2,$k$ are retained at 0 V. Even in such a second write operation, prior to execution of the second write operation, drain side select gate line SGD1,2 rises from 0 V to Vdd+Vt, whereby the body of the cell unit MU connected to bit lines BL applied with the power supply voltage Vdd are charged to the power supply voltage Vdd to be set to the floating state, and a similar write operation can be executed.

[Second Read Operation]

Figure 14:
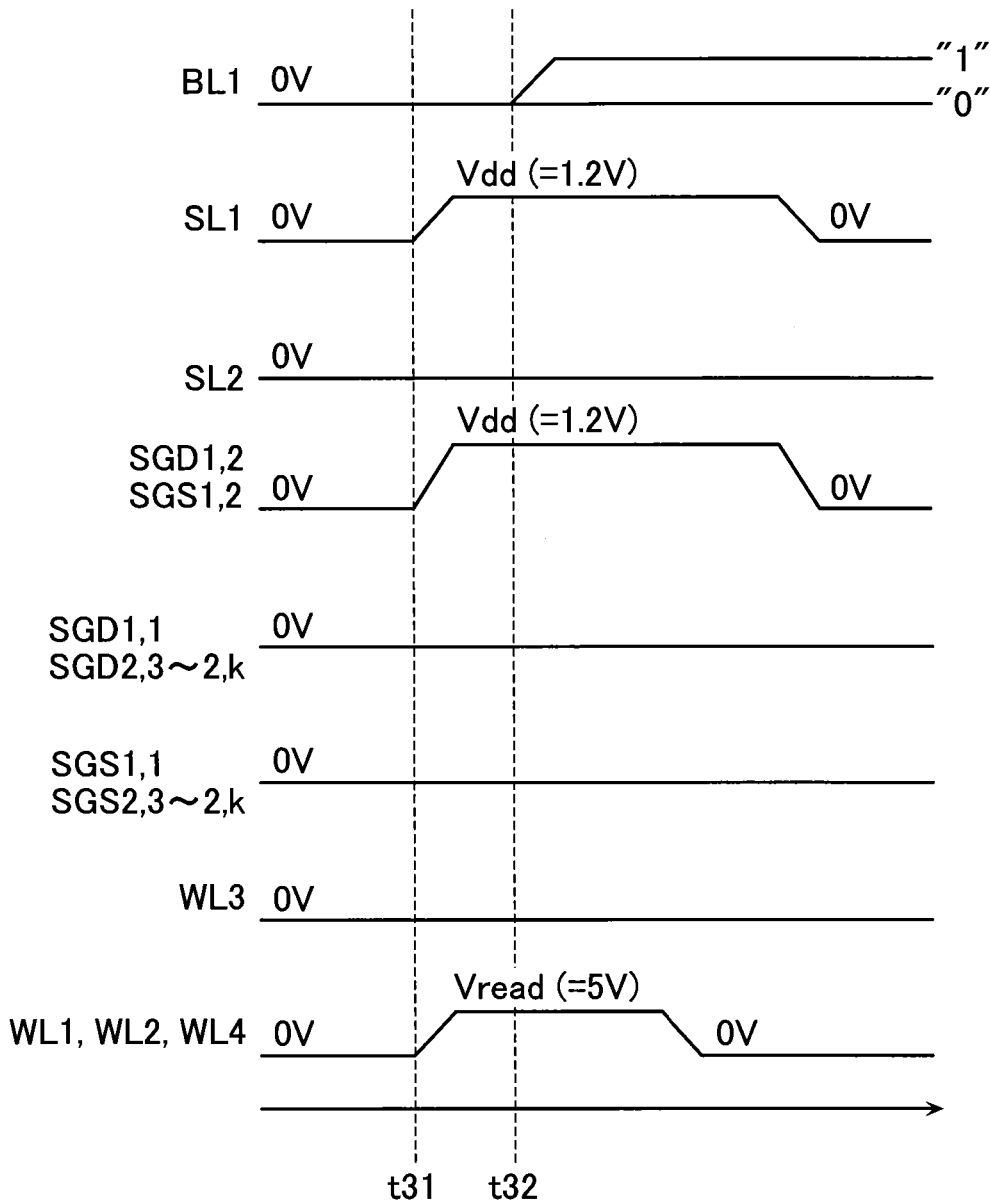
FIG. 14 is a timing chart of during a second read operation in the nonvolatile semiconductor memory device in accordance with the first embodiment.

Next, a second read operation in the nonvolatile semiconductor memory device in accordance with the first embodiment is described with reference to FIG. 14. In the second read operation, the voltage applied to gates of memory transistors MTr1,2,4 in selected cell unit sMU and the voltage applied to the gate of selected memory transistor sMTr3 differ from those of the first read operation. That is, as shown in FIG. 14, at time t31, the word line WL3 is retained at 0 V, and word lines WL1, WL2, and WL4 are raised to read voltage Vread.

[Method of Manufacturing]

Next, a method of manufacturing the nonvolatile semiconductor memory device in accordance with the first embodiment is described with reference to FIGS. 15-18.

Figure 15:
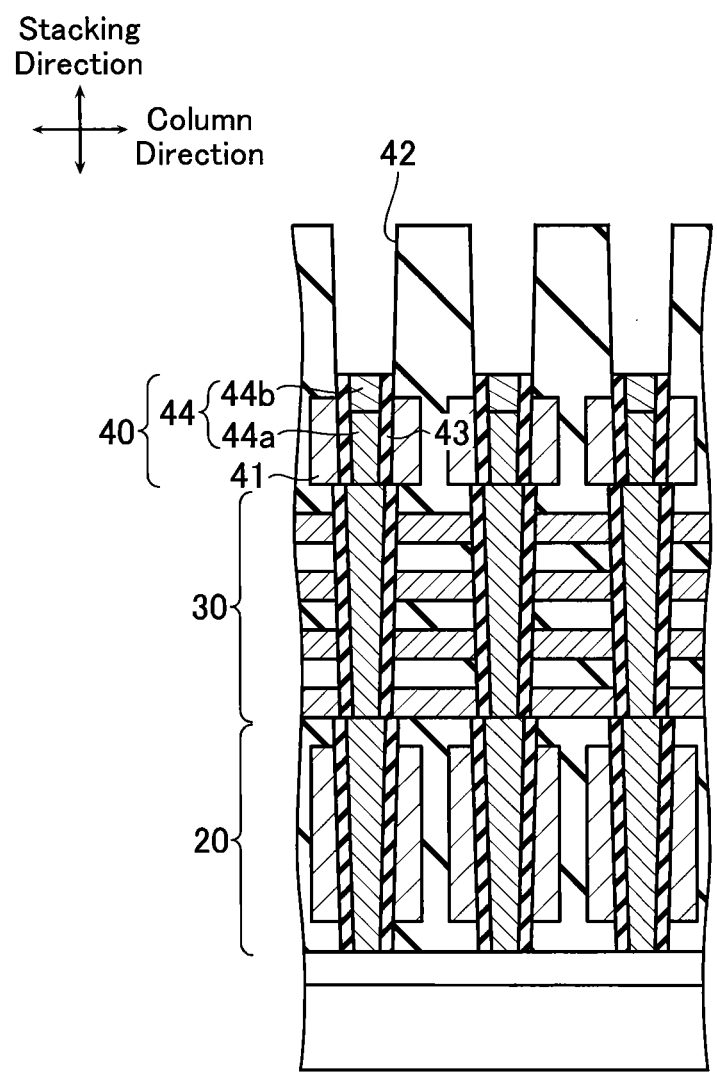
FIG. 15 is a cross-sectional view showing a manufacturing process of the nonvolatile semiconductor memory device in accordance with the first embodiment.

First, as shown in FIG. 15, the source side select transistor layer 20, memory transistor layer 30, and drain side select transistor layer 40 are formed. Now, an upper portion of the drain side hole 42 is not filled but left as is.

Figure 16:
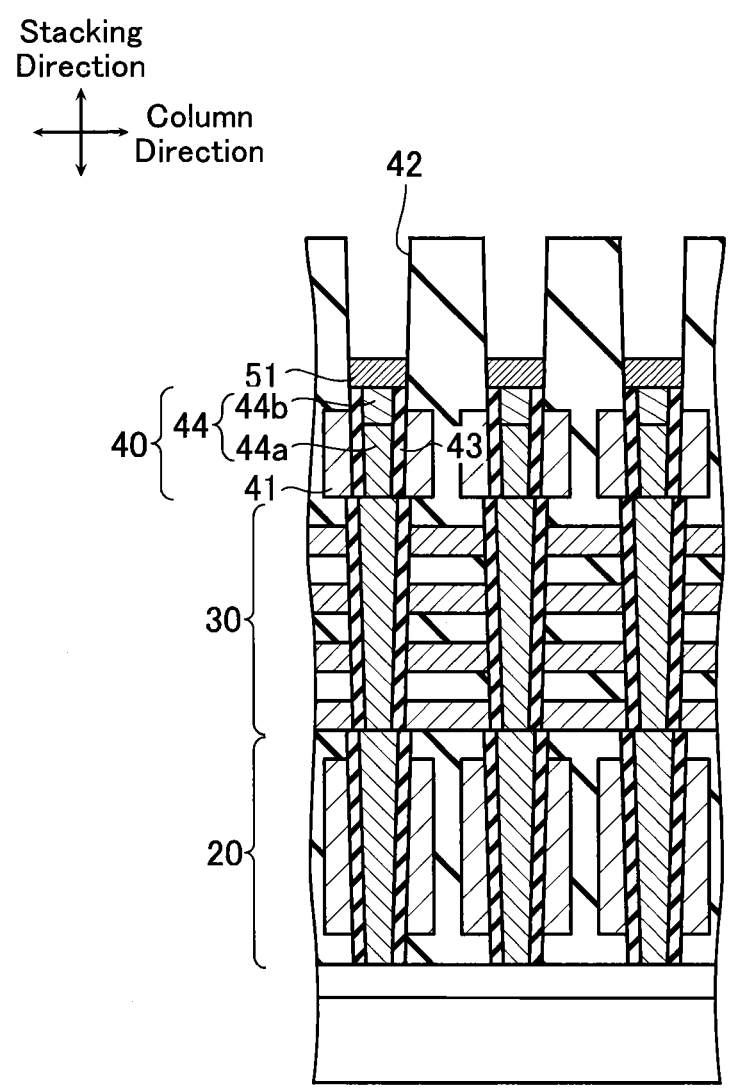
FIG. 16 is a cross-sectional view showing a manufacturing process of the nonvolatile semiconductor memory device in accordance with the first embodiment.
Figure 17:
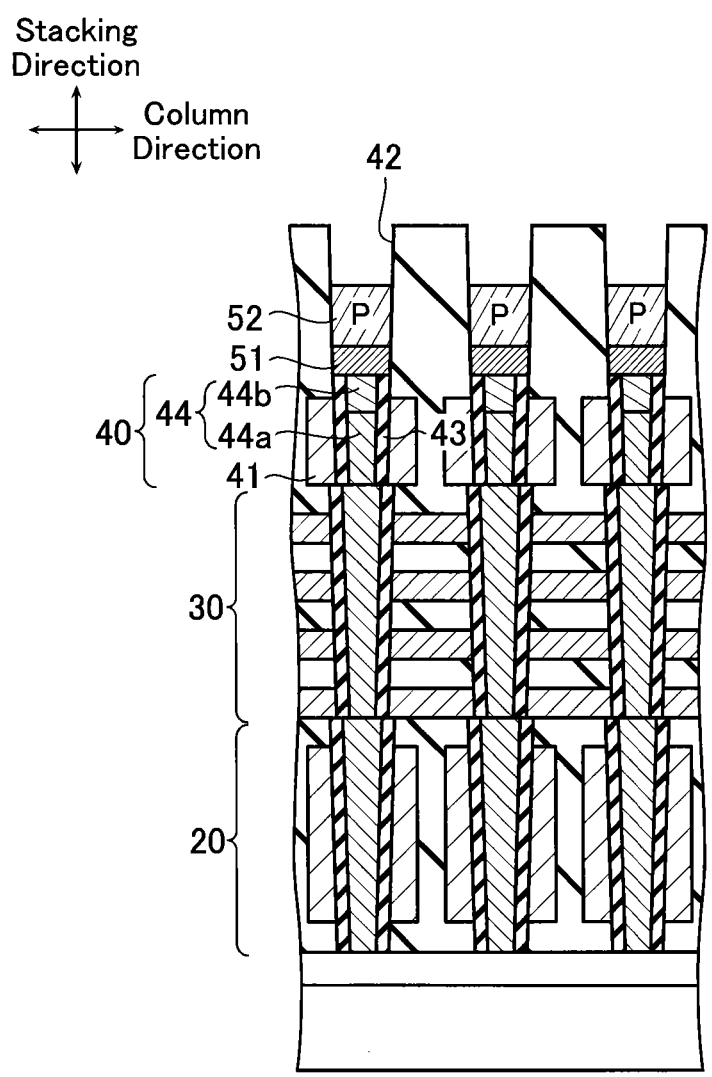
FIG. 17 is a cross-sectional view showing a manufacturing process of the nonvolatile semiconductor memory device in accordance with the first embodiment.
Figure 18:
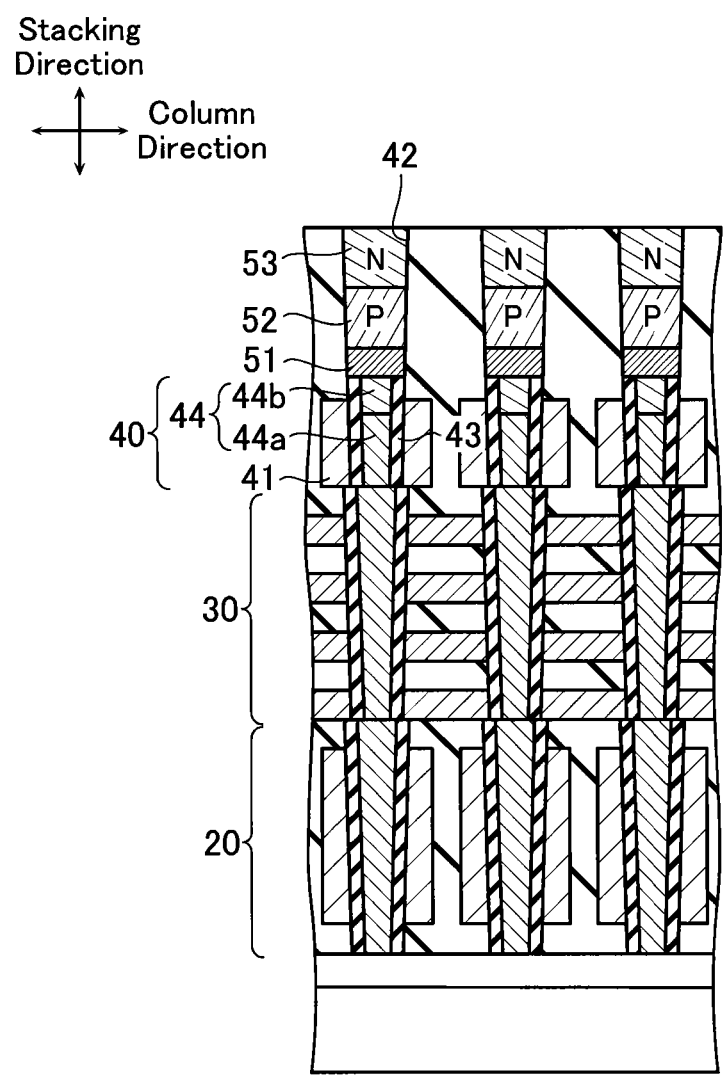
FIG. 18 is a cross-sectional view showing a manufacturing process of the nonvolatile semiconductor memory device in accordance with the first embodiment.

Next, as shown in FIG. 16, the ohmic contact layer 51 is deposited on an upper portion of the drain side columnar semiconductor layer 44 in the drain side hole 42. Subsequently, as shown in FIG. 17, the P type semiconductor layer 52 is deposited on an upper portion of the ohmic contact layer 51 in the drain side hole 42. Then, as shown in FIG. 18, the N type semiconductor layer 53 is deposited on an upper portion of the P type semiconductor layer 52 in the drain side hole 42. The N type semiconductor layer 53 is formed, for example, by depositing polysilicon and then implanting N+ ions in the polysilicon.

[Second Embodiment]

[Configuration]

Figure 19:
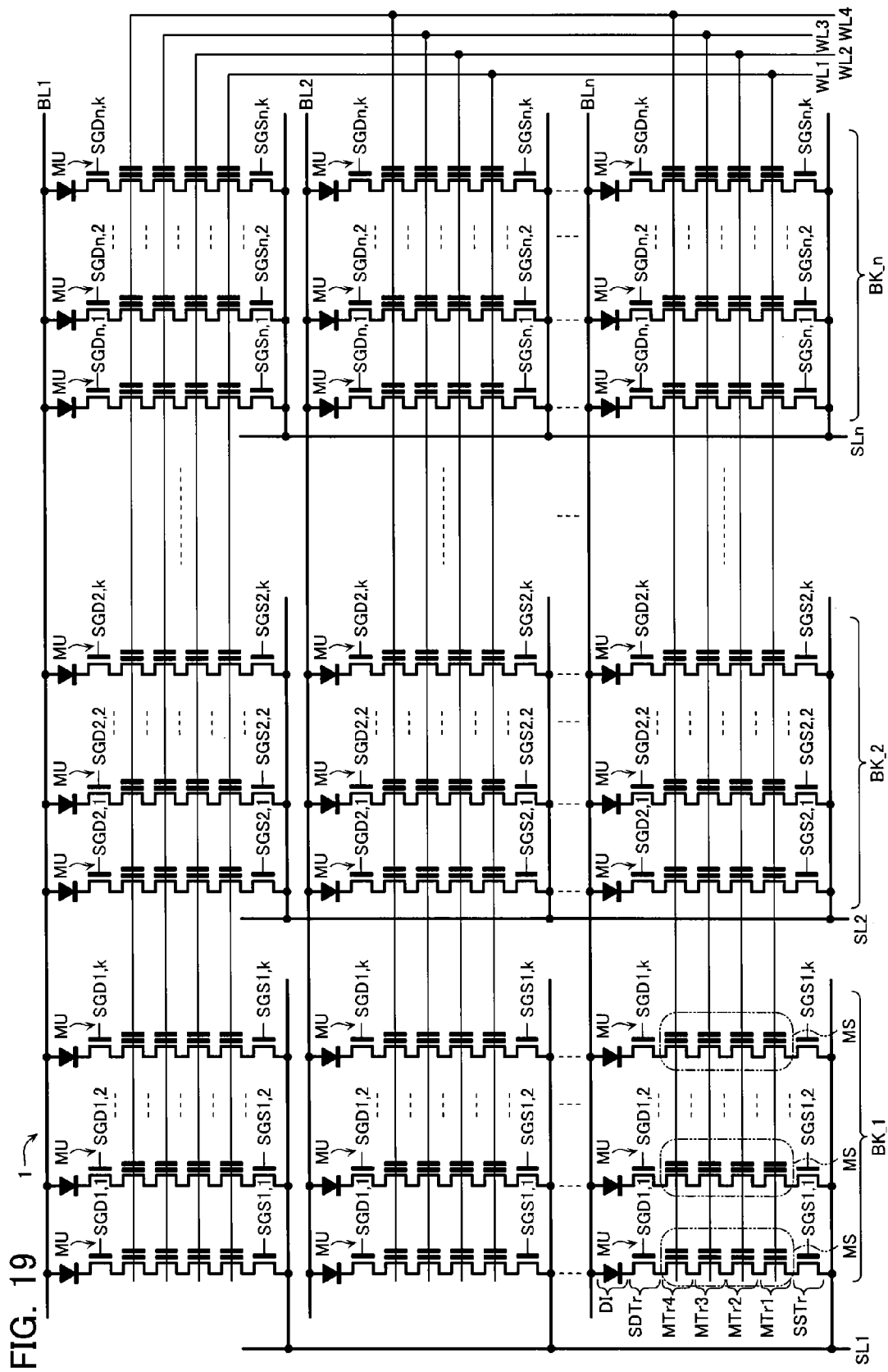
FIG. 19 is a circuit diagram of a memory cell array 1 in accordance with a second embodiment.

Next, a circuit configuration of a memory cell array 1 included in a nonvolatile semiconductor memory device in accordance with a second embodiment is described with reference to FIG. 19. As shown in FIG. 19, the second embodiment differs from the first embodiment in having the diode DI provided such that its forward bias direction is from the bit line BL side to the drain side select transistor SDTr side. Note that in the second embodiment, identical symbols are assigned to configurations similar to those of the first embodiment, and descriptions thereof are omitted.

Figure 20:
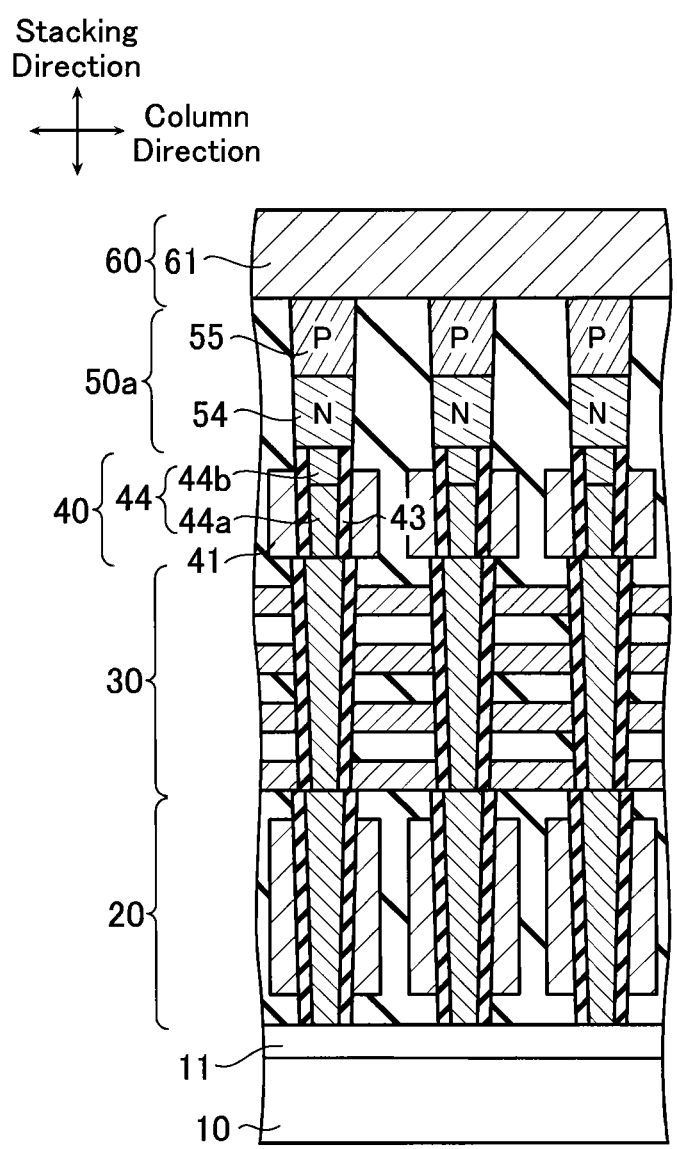
FIG. 20 is a cross-sectional view of a nonvolatile semiconductor memory device in accordance with the second embodiment.

The above-described circuit configuration of the nonvolatile semiconductor memory device is realized by a stacking structure shown in FIG. 20. FIG. 20 is a cross-sectional view of the nonvolatile semiconductor memory device in accordance with the second embodiment.

As shown in FIG. 20, a configuration of a diode 50$a$ in the second embodiment differs from that of the first embodiment. The diode 50$a$ includes an N type semiconductor layer 54 and a P type semiconductor layer 55. The N type semiconductor layer 54 is formed in a column shape to extend in the stacking direction from the upper surface of the drain side columnar semiconductor layer 44. The P type semiconductor layer 55 is formed in a column shape to extend in the stacking direction from an upper surface of the N type semiconductor layer 54. In addition, the P type semiconductor layer 55 is formed to have its upper surface in contact with a lower surface of the bit layer 61. The N type semiconductor layer 54 is configured by polysilicon doped with an N type impurity, and the P type semiconductor layer 55 is configured by polysilicon doped with a P type impurity.

[Erase Operation]

Next, an erase operation in the nonvolatile semiconductor memory device in accordance with the second embodiment is described with reference to FIG. 21.

Figure 21:
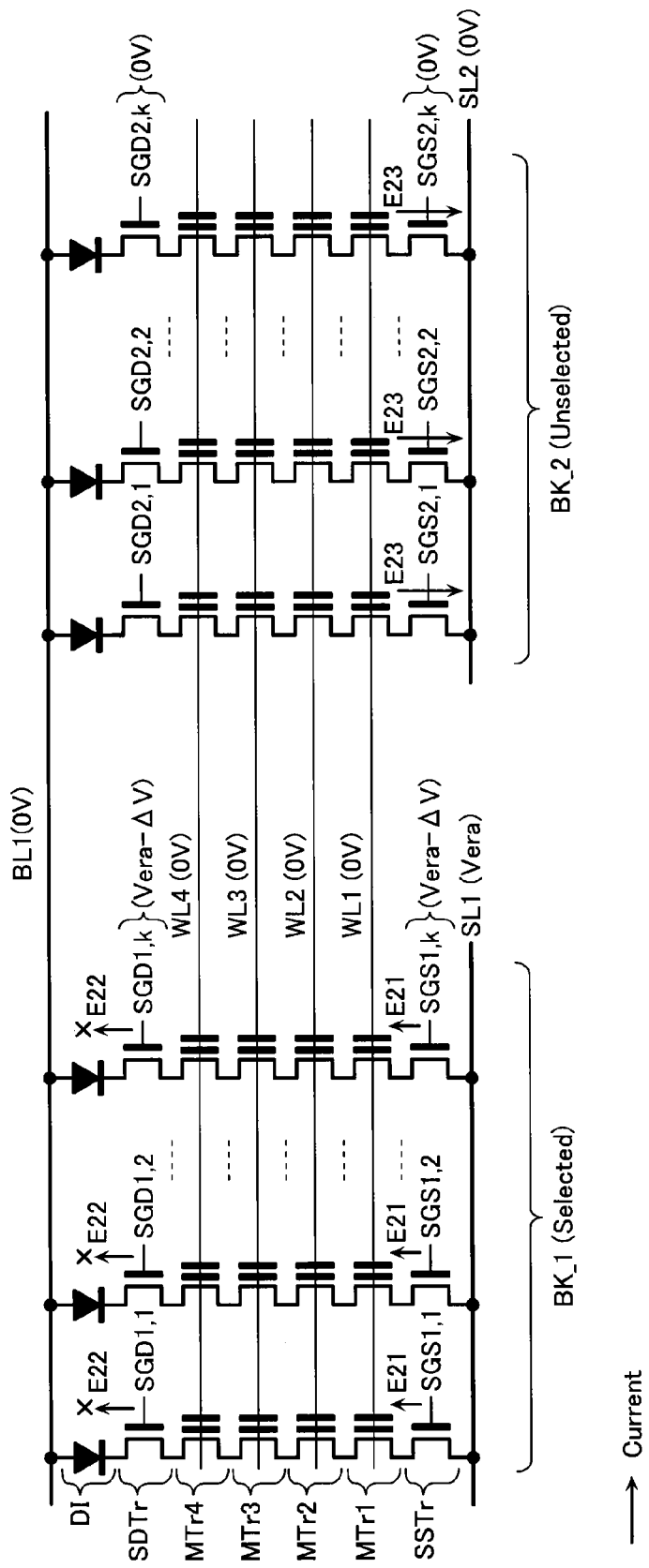
FIG. 21 is a schematic view of during an erase operation in the nonvolatile semiconductor memory device in accordance with the second embodiment.

As shown in FIG. 21, in the erase operation of the second embodiment, it is only in the vicinity of gates of source side select transistors SSTr in memory block BK_1 that the GIDL current is generated (refer to symbol "E21"); in the vicinity of gates of drain side select transistors SDTr in memory block BK_1, occurrence of the GIDL current is prohibited. The erase operation in the second embodiment differs in this regard from the erase operation in the first embodiment. Furthermore, the second embodiment includes a diode DI connected in a reverse direction to that of the first embodiment. This may suppress the current flowing from selected memory block BK_1 into bit line BL1 (refer to symbol "E22"). Consequently, no leak current flows in memory block BK_2. The above allows the erase operation in the second embodiment to suppress incorrect erase in unselected memory block BK_2.

Figure 22:
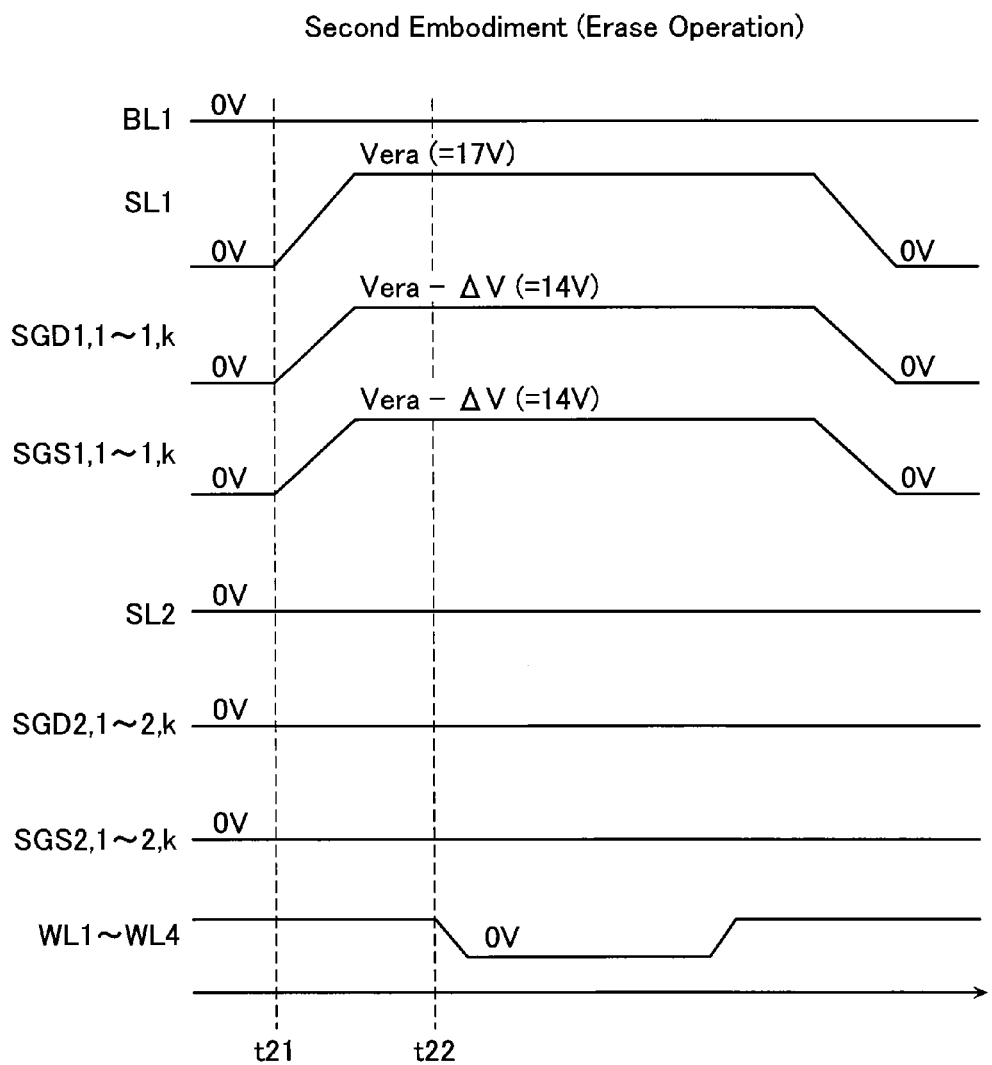
FIG. 22 is a timing chart of during the erase operation in the nonvolatile semiconductor memory device in accordance with the second embodiment.

As shown in FIG. 22, in contrast to the first embodiment, when executing the above-described erase operation, at time t11, bit line BL1 is retained at 0 V, and drain side select gate lines SGD2,1-SGD2,$k$ and source side select gate lines SGS2, 1-SGS2,$k$ are retained at 0 V.

[Write Operation]

Next, a write operation in the nonvolatile semiconductor memory device in accordance with the second embodiment is described with reference to FIGS. 23A and 23B.

Figure 23A:
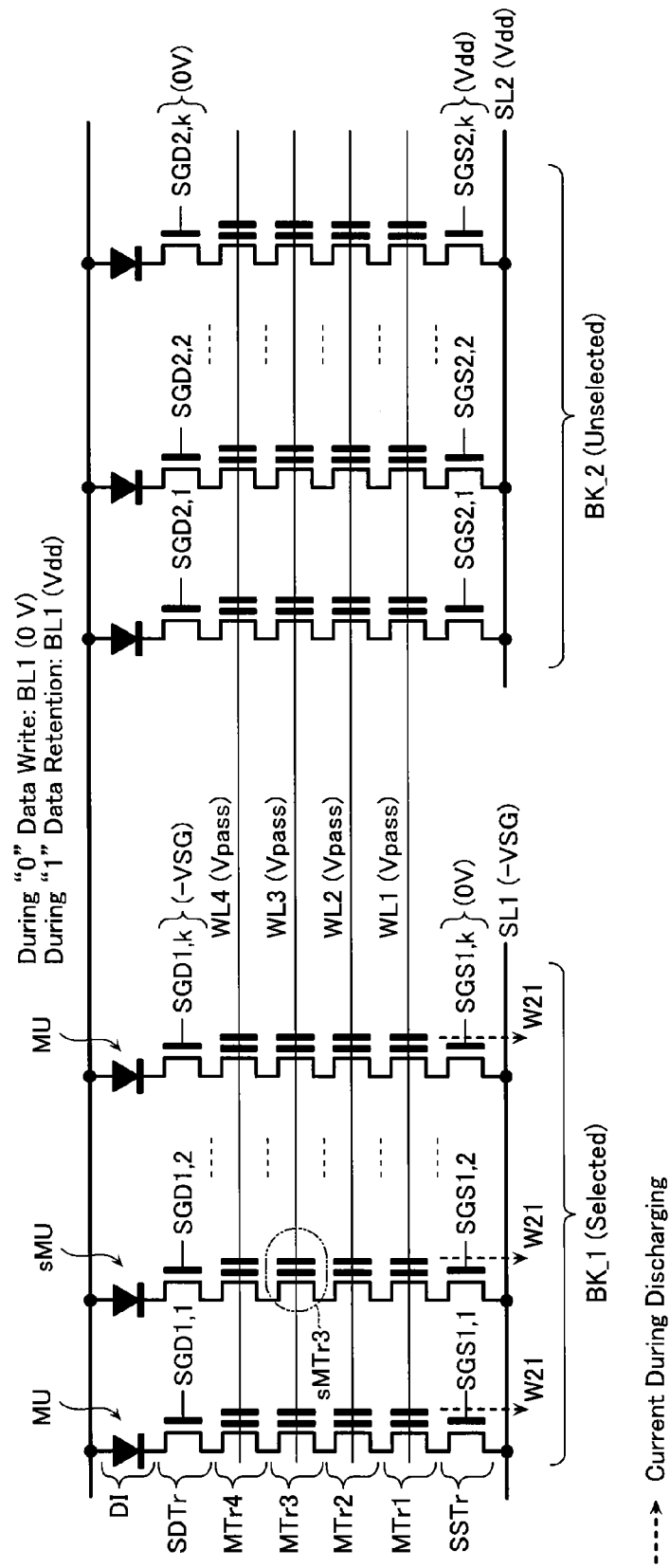
FIG. 23A is a schematic view of during a write operation in the nonvolatile semiconductor memory device in accordance with the second embodiment.
Figure 23B:
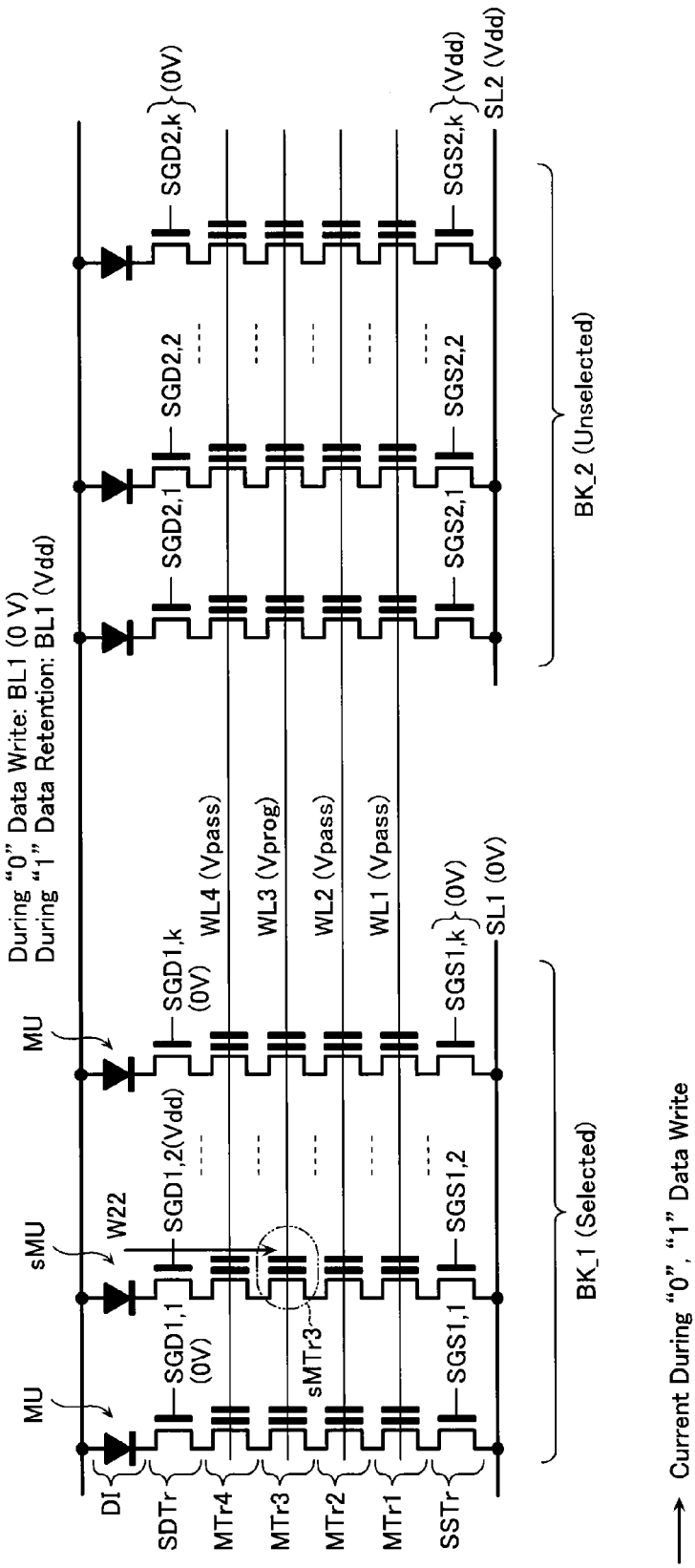
FIG. 23B is a schematic view of during the write operation in the nonvolatile semiconductor memory device in accordance with the second embodiment.

In FIGS. 23A and 23B, an example is described assuming write to be performed on memory transistor MTr3 in selected cell unit sMU in memory block BK_1.

The write operation in the nonvolatile semiconductor memory device in accordance with the second embodiment is similar to that of the first embodiment in having the voltage applied to bit line BL1 set to 0 V or the power supply voltage Vdd (=1.2 V). However, as shown in FIG. 23A, prior to start of the write operation, it has source line SL1 applied with a negative voltage −VSG, and differs from the first embodiment in this respect.

Source side select transistors SSTr in memory block BK_1 are applied with 0 V at their gates, whereby the body of cell units MU in memory block BK_1 is once charged to the negative voltage −VSG.

On the other hand, drain side select transistors SDTr in memory block BK_1 are applied with −VSG from the start at their gates, whereby, while the body of cell units MU in memory block BK_1 is being charged to the negative voltage −VSG, the drain side select transistors SDTr in memory block BK_1 are maintained turned off.

Subsequently, in the write operation stage, as shown in FIG. 23B, source line SL1 has its potential raised from the negative voltage −VSG to 0 V, and drain side select gate line SGD1,2 connected to selected cell unit sMU is applied with power supply voltage Vdd. This causes a potential of the body of selected cell unit sMU to become 0 V or the power supply voltage Vdd (floating state) according to the potential applied to bit line BL1. In addition, drain side select gate lines SGD1,1 and SGD1,3-1,k connected to unselected cell units MU in selected memory block BK_1 are applied with 0 V, whereby the body of the unselected cell units MU is charged to 0 V or the power supply voltage Vdd to be set to the floating state. Hereafter, the write operation on selected memory block BK_1 is executed in a similar manner to the first embodiment.

Note that in unselected memory block BK_2, drain side select gate lines SGD2,1-2,k are maintained at 0 V throughout, and source side select gate lines SGS2,1-2,k and source line SL2 are maintained at the power supply voltage Vdd throughout.

Figure 24:
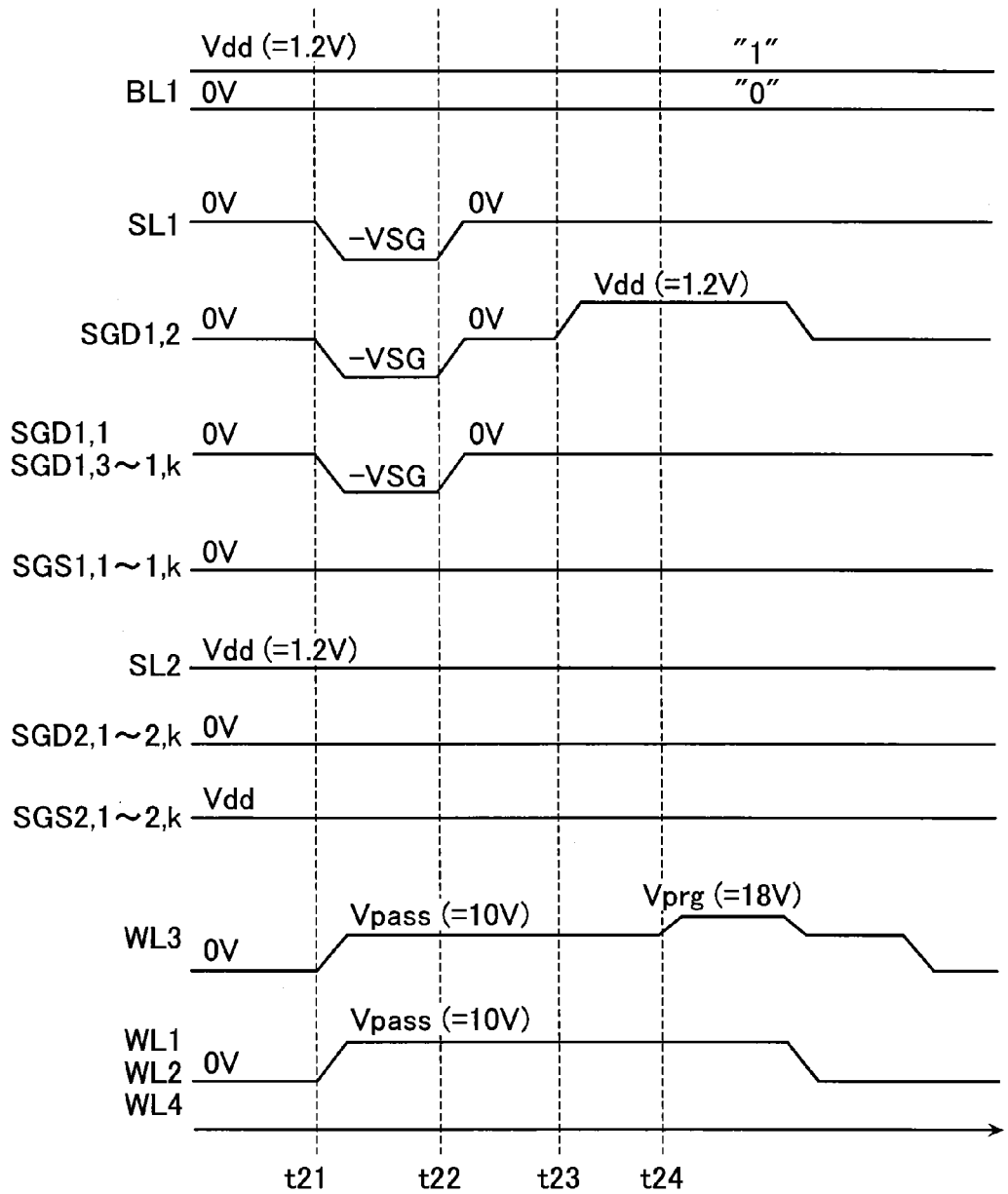
FIG. 24 is a timing chart of during the write operation in the nonvolatile semiconductor memory device in accordance with the second embodiment.

FIG. 24 shows a specific timing chart of the above-described operation. First, at time t21 in FIG. 24, source line SL1 and drain side select gate lines SGD1,1-SGD1,k are lowered to the negative voltage −VSG. This causes source side select transistors SSTr in memory block BK_1 to be turned on. Further, the voltage of the body of memory transistors MTr1-MTr4 included in memory block BK_1 is discharged to the same negative voltage −VSG as source line SL1. Additionally, at time t21, word lines WL1-WL4 are raised to the pass voltage Vpass.

Next, at time t22, source line SL1 and drain side select gate lines SGD1,1-SGD1,k are raised to 0 V. Subsequently, at time t23, drain side select gate line SGD1,2 is raised to voltage Vdd+Vt. This causes the drain side select transistor SDTr included in selected cell unit sMU to be turned on, whereby the voltage of the body of memory transistors MTr1-MTr4 included in selected cell unit sMU becomes 0 V or the power supply voltage Vdd (floating state).

Then, at time t24, word line WL3 is raised to the program voltage Vprog. This causes the write operation on selected memory transistor sMTr3 to be executed.

[Read Operation]

A read operation in the nonvolatile semiconductor memory device in accordance with the second embodiment is similar to that of the first embodiment, and description thereof is thus omitted.

[Third Embodiment]
[Configuration]

Next, a stacking structure of a nonvolatile semiconductor memory device in accordance with a third embodiment is described with reference to FIG. 25. Note that in the third embodiment, identical symbols are assigned to configurations similar to those of the first and second embodiments, and descriptions thereof are omitted.

Figure 25:
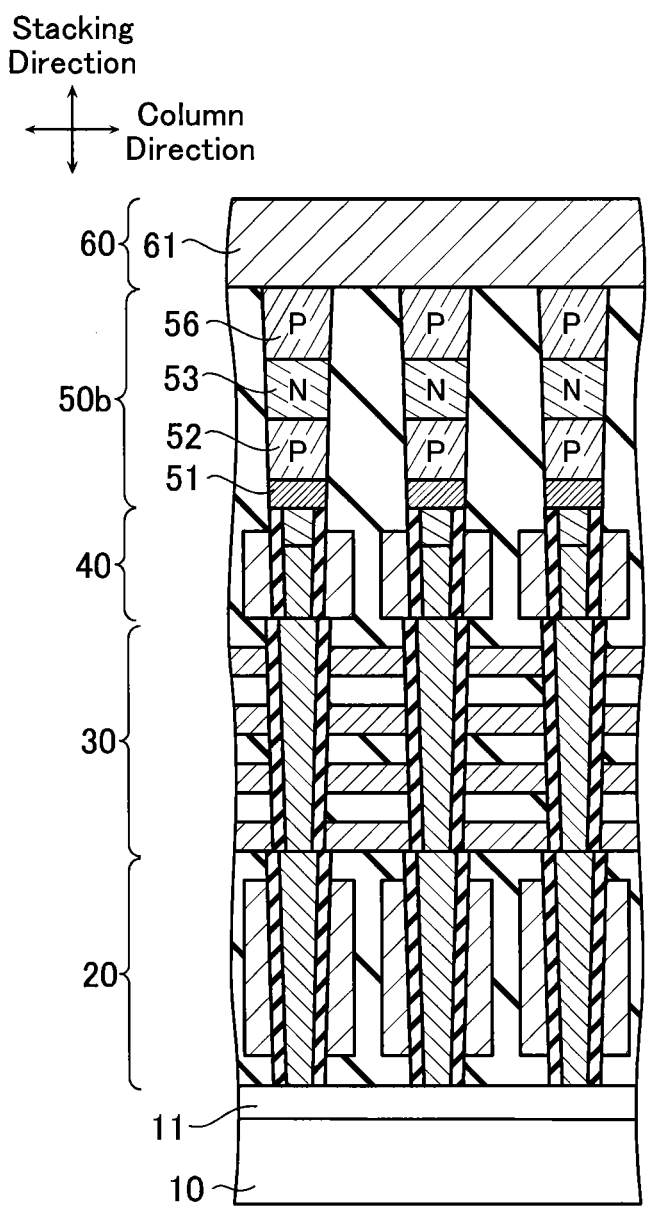
FIG. 25 is a cross-sectional view of a nonvolatile semiconductor memory device in accordance with a third embodiment.

As shown in FIG. 25, the third embodiment includes a diode layer 50b having a stacking structure substantially similar to that of the first embodiment. The diode layer 50b further includes a P type semiconductor layer 56 configured to extend in a column shape in the stacking direction from the upper surface of the N type semiconductor layer 53. This structure allows a bi-directional diode to be formed as the diode DI.

[Fourth Embodiment]
[Configuration]

Next, a stacking structure of a nonvolatile semiconductor memory device in accordance with a fourth embodiment is described with reference to FIG. 26. Note that in the fourth embodiment, identical symbols are assigned to configurations similar to those of the first through third embodiments, and descriptions thereof are omitted.

Figure 26:
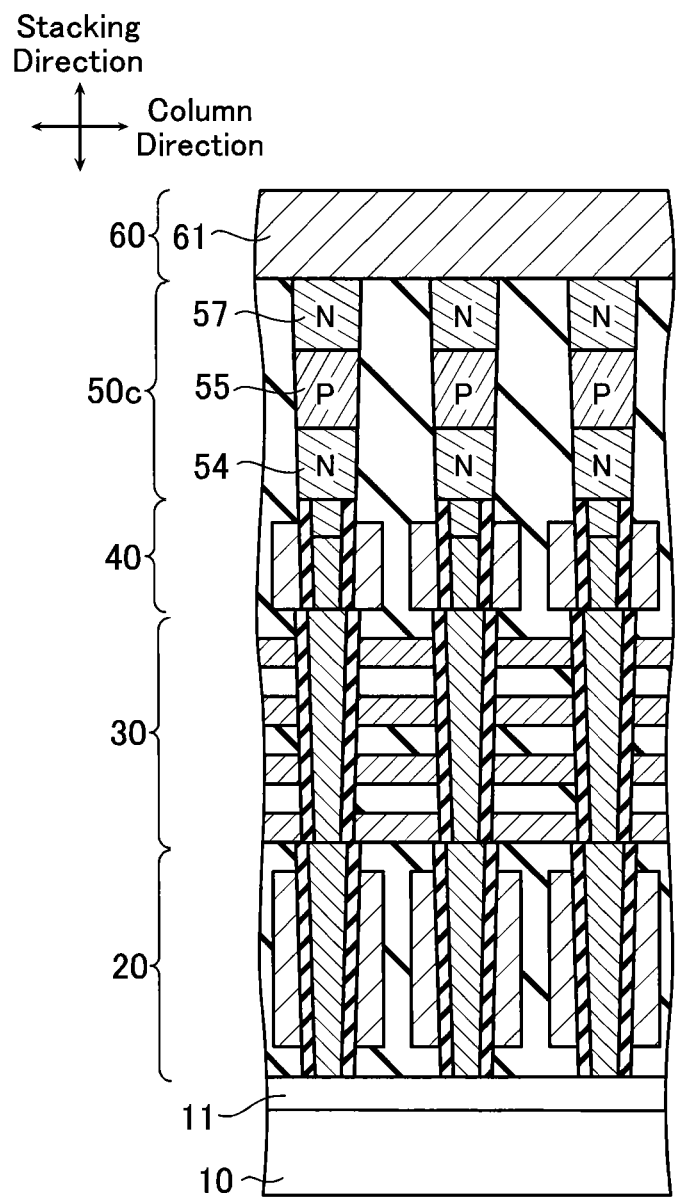
FIG. 26 is a cross-sectional view of a nonvolatile semiconductor memory device in accordance with a fourth embodiment.

As shown in FIG. 26, the fourth embodiment includes a diode layer 50c having a stacking structure substantially similar to that of the second embodiment. The diode layer 50c further includes an N type semiconductor layer 57 configured to extend in a column shape in the stacking direction from the upper surface of the P type semiconductor layer 55. This structure allows a bi-directional diode to be formed as the diode DI.

[Fifth Embodiment]

Next, a stacking structure of a nonvolatile semiconductor memory device in accordance with a fifth embodiment is described with reference to FIG. 27. Note that in the fifth embodiment, identical symbols are assigned to configurations similar to those of the first embodiment, and descriptions thereof are omitted.

Figure 27:
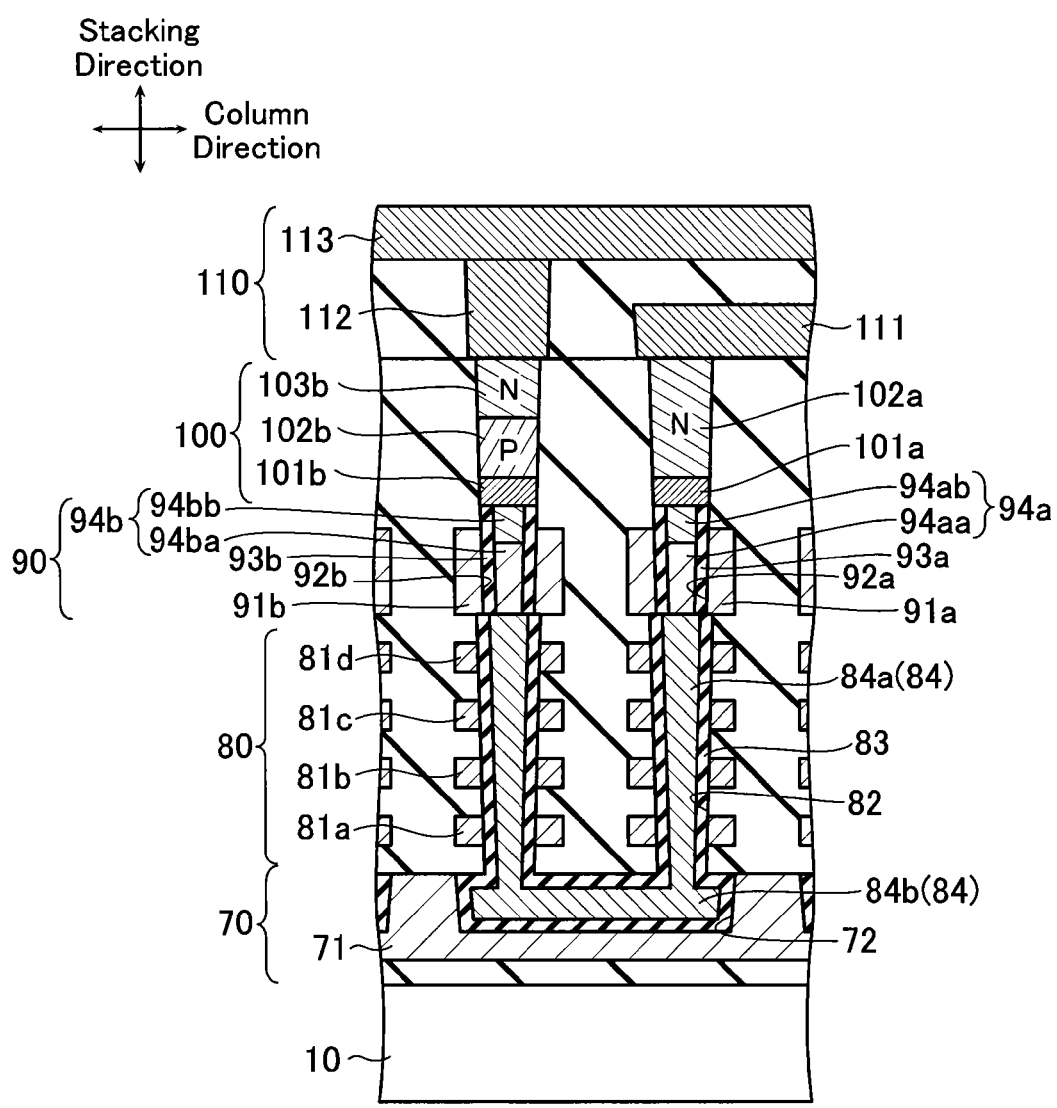
FIG. 27 is a cross-sectional view of a nonvolatile semiconductor memory device in accordance with a fifth embodiment.

The nonvolatile semiconductor memory device in accordance with the fifth embodiment differs greatly from the above-described embodiments in including a U-shaped memory semiconductor layer 84 shown in FIG. 27 in place of the I-shaped memory columnar semiconductor layer 34 of the above-described embodiments.

As shown in FIG. 27, the nonvolatile semiconductor memory device in accordance with the fifth embodiment includes, stacked sequentially on the semiconductor substrate 10, a back gate layer 70, a memory transistor layer 80, a select transistor layer 90, a diode layer 100, and a wiring layer 110. The memory transistor layer 80 functions as the memory transistors MTr. The select transistor layer 90 functions as the drain side select transistor SDTr and as the source side select transistor SSTr. The diode layer 100 functions as the diode DI. The wiring layer 110 functions as the source line SL and as the bit line BL.

The back gate layer 70 includes a back gate conductive layer 71, as shown in FIG. 27. The back gate conductive layer 71 is formed to extend two-dimensionally in the row direction and the column direction parallel to the substrate 10. The back gate conductive layer 71 is configured by polysilicon (poly-Si).

The back gate layer 70 includes a back gate hole 72, as shown in FIG. 27. The back gate hole 72 is formed to dig out the back gate conductive layer 71. The back gate hole 72 is formed in a substantially rectangular shape having the column direction as a long direction as viewed from an upper surface. The back gate holes 72 are formed in a matrix in the row direction and the column direction.

The memory transistor layer 80 is formed in a layer above the back gate layer 70, as shown in FIG. 27. The memory transistor layer 80 includes word line conductive layers 81a-81d. Each of the word line conductive layers 81a-81d functions as the word line WL and as the gate of the memory transistor MTr.

The word line conductive layers 81a-81d are stacked sandwiching interlayer insulating layers. The word line conductive layers 81a-81d are formed extending with the row direction as a long direction and having a certain pitch in the column direction. The word line conductive layers 81a-81d are configured by polysilicon (poly-Si).

The memory transistor layer 80 includes a memory hole 82, as shown in FIG. 27. The memory hole 82 is formed to penetrate the word line conductive layers 81a-81d and the interlayer insulating layers. The memory hole 82 is formed to align with a near vicinity of an end of the back gate hole 72 in the column direction.

Moreover, the back gate layer 70 and the memory transistor layer 80 include a memory gate insulating layer 83 and a memory semiconductor layer 84, as shown in FIG. 27. The memory semiconductor layer 84 functions as a body of the memory transistors MTr (memory string MS). The memory gate insulating layer 83 includes a charge storage layer configured to store a charge, similarly to the above-described embodiments.

The memory semiconductor layer 84 is formed to fill the back gate hole 72 and the memory hole 82. The memory semiconductor layer 84 is formed in a U shape as viewed from the row direction. The memory semiconductor layer 84 includes a pair of columnar portions 84a extending in the perpendicular direction with respect to the substrate 10, and a joining portion 84b configured to join lower ends of the pair of columnar portions 84a. The memory semiconductor layer 84 is configured by polysilicon (poly-Si).

Expressing the above-described configuration of the back gate layer 70 in other words, the back gate conductive layer 71 is formed to surround the joining portion 84b with the memory gate insulating layer 83 interposed therebetween. Moreover, expressing the above-described configuration of the memory transistor layer 80 in other words, the word line conductive layers 81a-81d are formed to surround the columnar portions 84a with the memory gate insulating layer 83 interposed therebetween.

The select transistor layer 90 includes a source side conductive layer 91a and a drain side conductive layer 91b, as shown in FIG. 27. The source side conductive layer 91a functions as the source side select gate line SGS and as the gate of the source side select transistor SSTr. The drain side conductive layer 91b functions as the drain side select gate line SGD and as the gate of the drain side select transistor SDTr.

The source side conductive layer 91a is formed in a layer above one of the columnar portions 84a configuring the memory semiconductor layer 84. The drain side conductive layer 91b is in the same layer as the source side conductive layer 91a and formed in a layer above the other of the columnar portions 84a configuring the memory semiconductor layer 84. The source side conductive layer 91a and the drain side conductive layer 91b are formed in stripes extending in the row direction and having a certain pitch in the column direction. The source side conductive layer 91a and the drain side conductive layer 91b are configured by polysilicon (poly-Si).

The select transistor layer 90 includes a source side hole 92a and a drain side hole 92b, as shown in FIG. 27. The source side hole 92a is formed to penetrate the source side conductive layer 91a. The drain side hole 92b is formed to penetrate the drain side conductive layer 91b. The source side hole 92a and the drain side hole 92b are each formed at a position aligning with the memory hole 82.

The select transistor layer 90 includes a source side gate insulating layer 93a, a source side columnar semiconductor layer 94a, a drain side gate insulating layer 93b, and a drain side columnar semiconductor layer 94b, as shown in FIG. 27. The source side columnar semiconductor layer 94a functions as a body of the source side select transistor SSTr. The drain side columnar semiconductor layer 94b functions as a body of the drain side select transistor SDTr.

The source side gate insulating layer 93a is formed with a certain thickness on a side surface of the source side hole 92a. The source side columnar semiconductor layer 94a is formed in a column shape to extend in the perpendicular direction with respect to the substrate 10 and to be in contact with a side surface of the source side gate insulating layer 93a and one of upper surfaces of the pair of columnar portions 84a. The source side gate insulating layer 93a is configured by silicon oxide ($SiO_2$). The source side columnar semiconductor layer 94a is configured by polysilicon (poly-Si). The source side columnar semiconductor layer 94a has a lower portion 94aa configured by an intrinsic semiconductor and an upper portion 94ab configured by an N+ type semiconductor.

The drain side gate insulating layer 93b is formed with a certain thickness on a side surface of the drain side hole 92b. The drain side columnar semiconductor layer 94b is formed in a column shape to extend in the perpendicular direction with respect to the substrate 10 and to be in contact with a side surface of the drain side gate insulating layer 93b and the other of the upper surfaces of the pair of columnar portions 84a. The drain side gate insulating layer 93b is configured by silicon oxide ($SiO_2$). The drain side columnar semiconductor layer 94b is configured by polysilicon (poly-Si). The drain side columnar semiconductor layer 94b has a lower portion 94ba configured by an intrinsic semiconductor and an upper portion 94bb configured by an N+ type semiconductor.

The diode layer 100 includes a source side ohmic contact layer 101a, a source side N type semiconductor layer 102a, a drain side ohmic contact layer 101b, a drain side P type semiconductor layer 102b, and a drain side N type semiconductor layer 103b, as shown in FIG. 27. The drain side P type semiconductor layer 102b and drain side N type semiconductor layer 103b function as the diode DI.

The source side ohmic contact layer 101a is formed in a column shape extending in the stacking direction from an upper surface of the source side columnar semiconductor layer 94a. The source side N type semiconductor layer 102a is formed in a column shape extending in the stacking direction from an upper surface of the source side ohmic contact layer 101a. The source side N type semiconductor layer 102a is configured by polysilicon including an N type impurity.

The drain side ohmic contact layer 101b is formed in a column shape extending in the stacking direction from an upper surface of the drain side columnar semiconductor layer 94b. The drain side P type semiconductor layer 102b is formed in a column shape extending in the stacking direction from an upper surface of the drain side ohmic contact layer 101b. The drain side N type semiconductor layer 103b is formed in a column shape extending in the stacking direction from an upper surface of the drain side P type semiconductor layer 102b. The drain side P type semiconductor layer 102b is configured by polysilicon including a P type impurity, and the drain side N type semiconductor layer 103b is configured by polysilicon including an N type impurity.

The wiring layer 110 includes a source layer 111, a plug layer 112, and a bit layer 113. The source layer 111 functions as the source line SL. The bit layer 113 functions as the bit line BL.

The source layer 111 is formed to extend in the row direction and to be in contact with an upper surface of the source side N type semiconductor layer 102a. The bit layer 113 is formed to extend in the column direction and to be in contact with an upper surface of the drain side N type semiconductor layer 103b via the plug layer 112. The source layer 111, the plug layer 112, and the bit layer 113 are configured by a metal such as tungsten.

[Method of Manufacturing]

Next, a method of manufacturing the nonvolatile semiconductor memory device in accordance with the fifth embodiment is described with reference to FIGS. 28-32.

Figure 28:
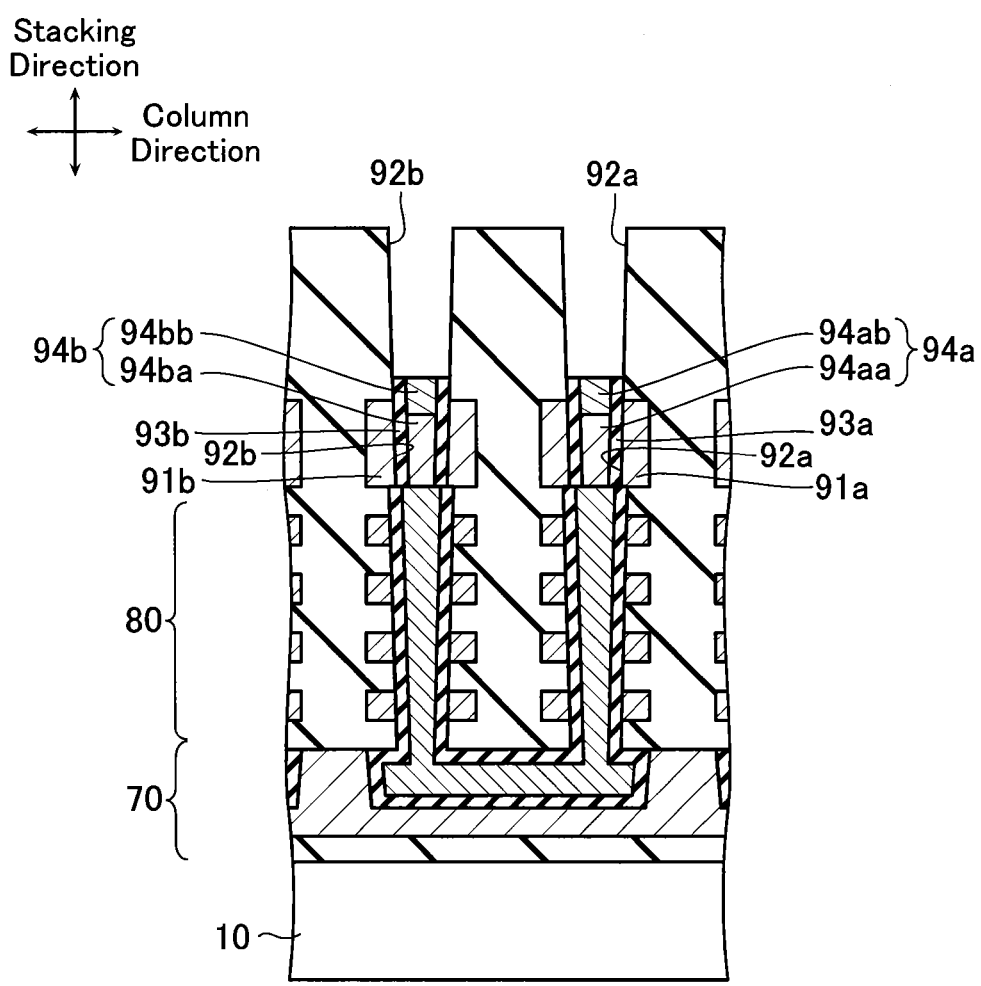
FIG. 28 is a cross-sectional view showing a manufacturing process of the nonvolatile semiconductor memory device in accordance with the fifth embodiment.

First, as shown in FIG. 28, the back gate layer 70, memory transistor layer 80, and select transistor layer 90 are formed. Now, an upper portion of the source side hole 92a and an upper portion of the drain side hole 92b are not filled but left as is.

Figure 29:
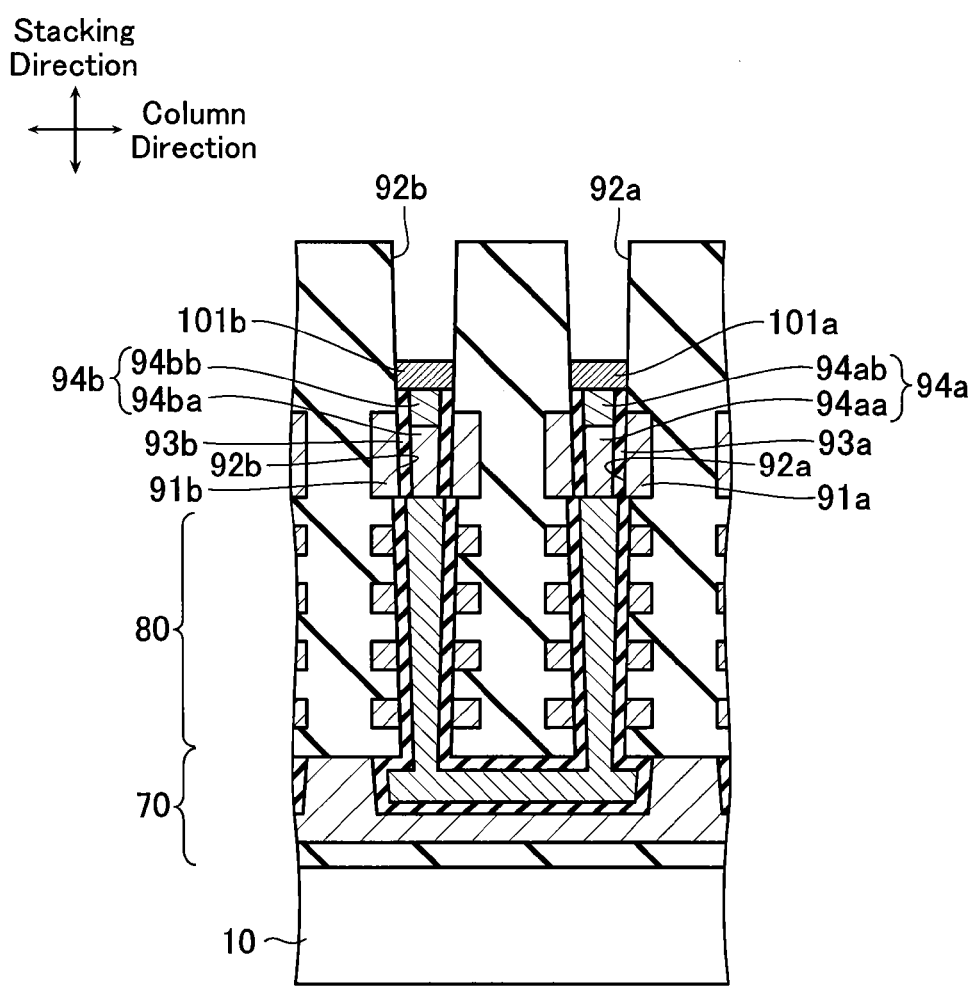
FIG. 29 is a cross-sectional view showing a manufacturing process of the nonvolatile semiconductor memory device in accordance with the fifth embodiment.

Next, as shown in FIG. 29, the source side ohmic contact layer 101a is deposited on an upper portion of the source side columnar semiconductor layer 94a in the source side hole 92a. In addition, the drain side ohmic contact layer 101b is deposited on an upper portion of the drain side columnar semiconductor layer 94b in the drain side hole 92b.

Figure 30:
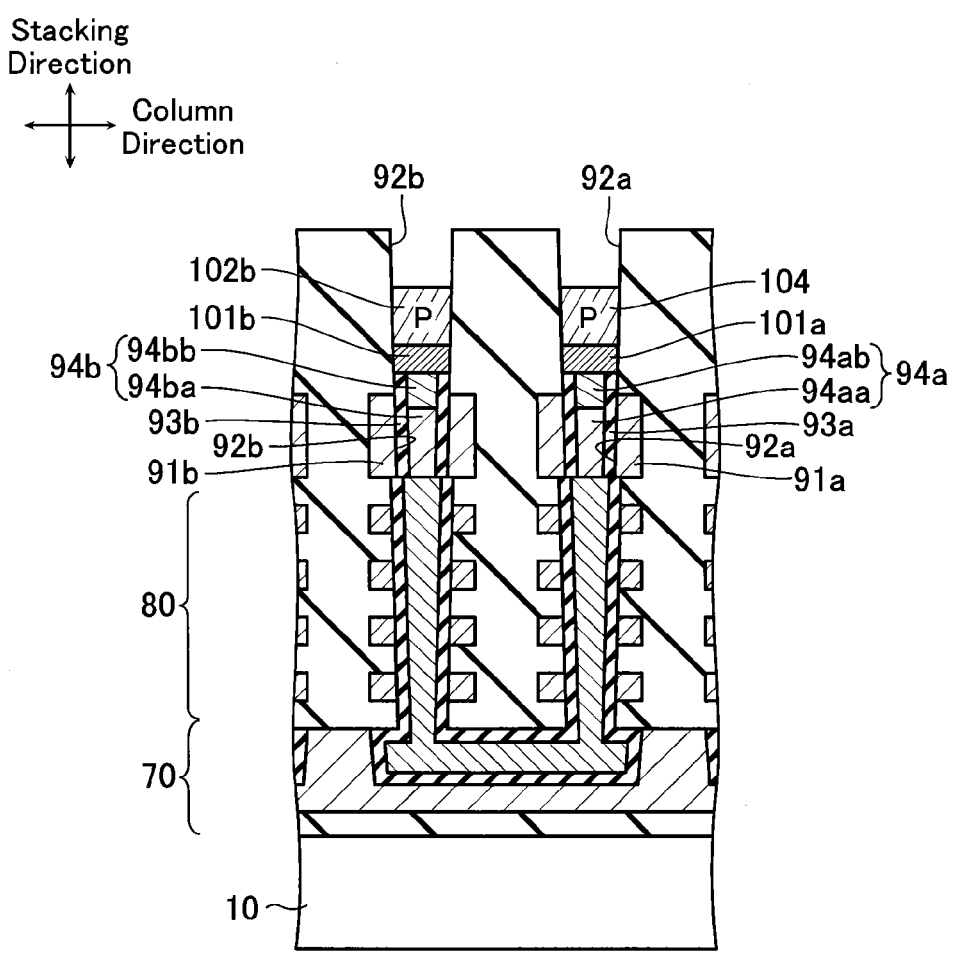
FIG. 30 is a cross-sectional view showing a manufacturing process of the nonvolatile semiconductor memory device in accordance with the fifth embodiment.
Figure 31:
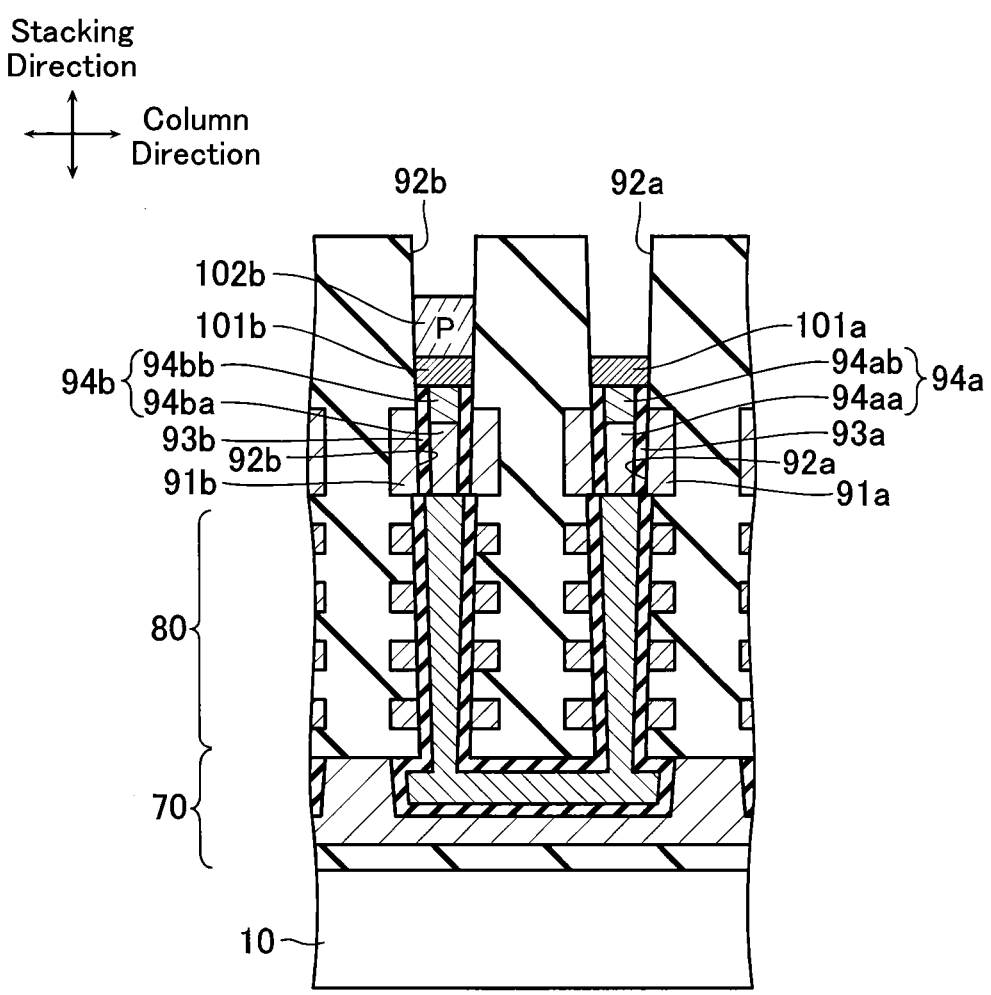
FIG. 31 is a cross-sectional view showing a manufacturing process of the nonvolatile semiconductor memory device in accordance with the fifth embodiment.

Subsequently, as shown in FIG. 30, a source side P type semiconductor layer 104 is deposited on an upper portion of the source side ohmic contact layer 101a in the source side hole 92a. In addition, the drain side P type semiconductor layer 102b is deposited on an upper portion of the drain side ohmic contact layer 101b in the drain side hole 92b. Next, as shown in FIG. 31, the source side P type semiconductor layer 104 in the source side hole 92a is removed.

Figure 32:
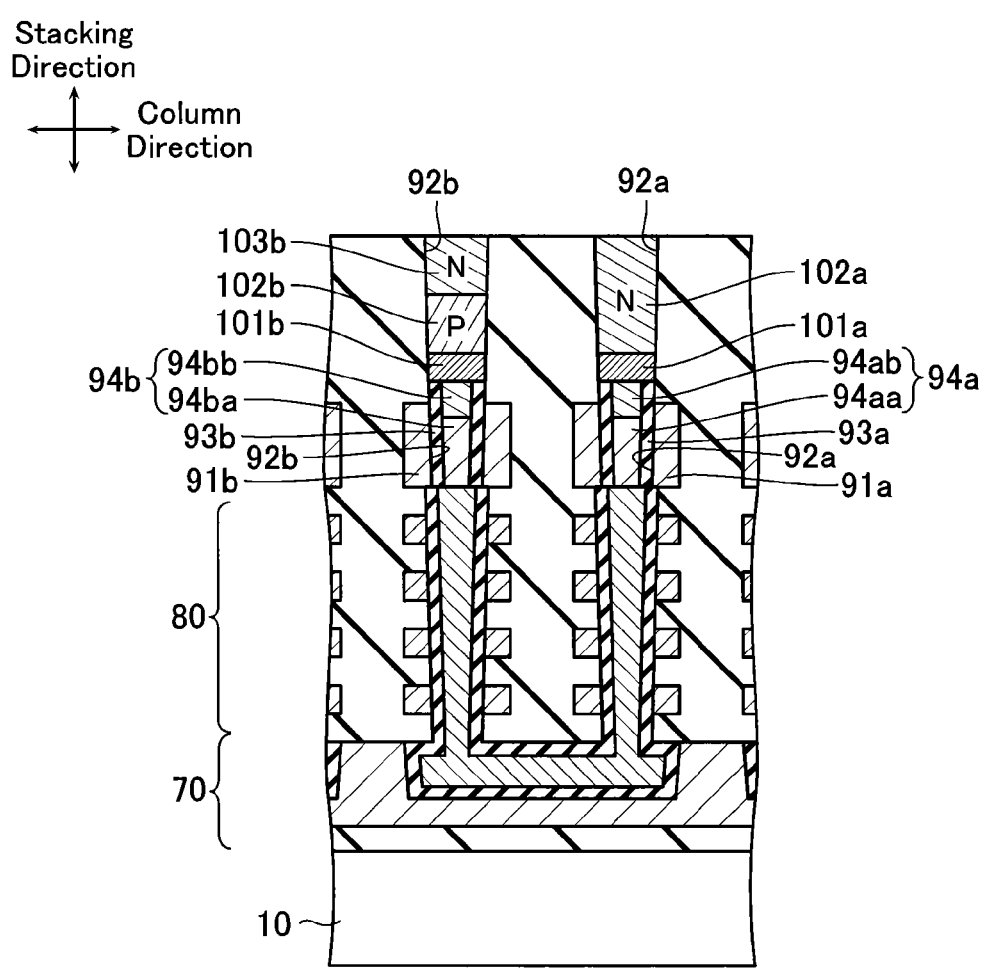
FIG. 32 is a cross-sectional view showing a manufacturing process of the nonvolatile semiconductor memory device in accordance with the fifth embodiment.

Subsequently, as shown in FIG. 32, the source side N type semiconductor layer 102a is deposited on the upper surface of the source side ohmic contact layer 101a in the source side hole 92a. In addition, the drain side N type semiconductor layer 103b is deposited on an upper surface of the drain side P type semiconductor layer 102b in the drain side hole 92b. The source side N type semiconductor layer 102a and drain side N type semiconductor layer 103b are formed, for example, by depositing polysilicon and then implanting N+ ions in the polysilicon.

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
 a plurality of memory units each including a plurality of memory transistors, a first transistor, and a second transistor, the plurality of memory units including a first memory unit and a second memory unit;
 a first line electrically connected to a first end of the first memory unit and a first end of the second memory unit;
 a second line electrically connected to a second end of the first memory unit, the second line being connected to the first transistor in the first memory unit; and
 a controller configured to perform a program operation, the program operation including a first phase, a second phase, and a third phase,
 the controller configured in the first phase to apply a first pass voltage to gates of a selected memory transistor and unselected memory transistors in the first memory unit, to apply a first voltage to a gate of the first transistor, and to apply a second voltage lower than the first voltage to the second line,
 the controller configured in the second phase to apply a third voltage to a gate of the second transistor, to apply a fourth voltage to the first line, the third voltage being higher than the fourth voltage, and to apply the first pass voltage to gates of the selected memory transistor and the unselected memory transistors in the first memory unit,
 the controller in the third phase configured to apply the first pass voltage to gate of the unselected memory transistors in the first memory unit, to apply a program voltage to gate of the selected memory transistor in the first memory unit, to apply the third voltage to the gate of the second transistor, and to apply the fourth voltage to the first line.

2. The nonvolatile semiconductor memory device according to claim 1, wherein
 the controller is configured to perform an erase operation on a condition that an erase voltage is applied to the first line or the second line, a fifth voltage is applied to the gate of the first transistor or the gate of the second transistor, the fifth voltage being lower than the erase voltage.

3. The nonvolatile semiconductor memory device according to claim 2, wherein the controller is configured to perform the erase operation on a condition that zero voltage is applied to gates of memory transistors selected as erase target.

4. The nonvolatile semiconductor memory device according to claim 3, further comprising a third line electrically connected to the other end of the second memory unit, and wherein zero voltage is applied to the third line in the erase operation.

5. The nonvolatile semiconductor memory device according to claim 4, wherein
 the controller is configured to perform a read operation on the condition that a read voltage is applied to the gate of the selected memory transistor, and a second pass voltage is applied to the gates of the unselected memory transistors.

6. The nonvolatile semiconductor memory device according to claim 2, further comprising a third line electrically connected to the other end of the second memory unit, and wherein zero voltage is applied to the third line in the erase operation.

7. The nonvolatile semiconductor memory device according to claim 6, wherein
 the controller is configured to perform a read operation on the condition that a read voltage is applied to the gate of the selected memory transistor, and a second pass voltage is applied to the gates of the unselected memory transistors.

8. The nonvolatile semiconductor memory device according to claim 7, wherein memory transistors in the plurality of memory units are stacked.

9. The nonvolatile semiconductor memory device according to claim 1, wherein
the controller is configured to perform a read operation on the condition that a read voltage is applied to the gate of the selected memory transistor, and a second pass voltage is applied to the gates of the unselected memory transistors.

10. The nonvolatile semiconductor memory device according to claim 1, wherein
memory transistors in the plurality of memory units are stacked.

* * * * *